(12) United States Patent
Miyamoto et al.

(10) Patent No.: US 8,767,038 B2
(45) Date of Patent: Jul. 1, 2014

(54) METHOD AND DEVICE FOR SYNTHESIZING PANORAMA IMAGE USING SCANNING CHARGED-PARTICLE MICROSCOPE

(75) Inventors: Atsushi Miyamoto, Yokohama (JP); Go Kotaki, Kumamoto (JP); Ryoichi Matsuoka, Yotsukaido (JP)

(73) Assignee: Hitachi High-Technologies Corporation, Tokyo (JP)

( * ) Notice: Subject to any disclaimer, the term of this patent is extended or adjusted under 35 U.S.C. 154(b) by 497 days.

(21) Appl. No.: 13/058,226

(22) PCT Filed: Sep. 2, 2009

(86) PCT No.: PCT/JP2009/004323
§ 371 (c)(1),
(2), (4) Date: Apr. 15, 2011

(87) PCT Pub. No.: WO2010/029708
PCT Pub. Date: Mar. 18, 2010

(65) Prior Publication Data
US 2011/0181688 A1  Jul. 28, 2011

(30) Foreign Application Priority Data

Sep. 11, 2008 (JP) .................................. 2008-233720

(51) Int. Cl.
*H04N 7/00* (2011.01)
*G01B 15/04* (2006.01)
*H01J 37/22* (2006.01)
*H01J 37/21* (2006.01)
*H01J 37/28* (2006.01)

(52) U.S. Cl.
CPC .............. *G01B 15/04* (2013.01); *H01J 37/222* (2013.01); *H01J 37/21* (2013.01); *H01J 37/28* (2013.01); *H01J 2237/21* (2013.01); *H01J 2237/24578* (2013.01); *H01J 2237/221* (2013.01); *H01J 2237/2817* (2013.01)
USPC ............ 348/36; 348/E7.001; 348/80; 348/87; 382/149; 250/307

(58) Field of Classification Search
None
See application file for complete search history.

(56) References Cited

U.S. PATENT DOCUMENTS 7,235,782 B2  6/2007  Takane et al.
7,365,322 B2  4/2008  Miyamoto et al.
7,559,047 B2  7/2009  Miyamoto et al.
7,615,746 B2  11/2009  Nagatomo et al.

(Continued)

FOREIGN PATENT DOCUMENTS

JP   2002-328015   11/2002
JP   2006-351746   12/2006

(Continued)

*Primary Examiner* — Christopher S Kelley
*Assistant Examiner* — Kaitlin A Retallick
(74) *Attorney, Agent, or Firm* — Antonelli, Terry, Stout & Krauss, LLP.

(57) ABSTRACT

Provided is a panorama image synthesis technique using a scanning charged-particle microscope and capable of obtaining a panorama image synthesis that is robust against contamination and the imaging shift and distortion of an image in a wide-field imaging region (EP) for semiconductor fine patterns. The panorama image synthesis technique in the wide-field imaging region (EP) using the scanning charged-particle microscope is characterized in that the layout of each adjustment point, each local imaging region, and an imaging sequence comprising the imaging order of the each adjustment point are optimized and created as an imaging recipe.

5 Claims, 15 Drawing Sheets

(56) References Cited

U.S. PATENT DOCUMENTS

| | | |
|---|---|---|
| 2002/0142496 A1 | 10/2002 | Nakasuji et al. |
| 2002/0158199 A1 | 10/2002 | Takane et al. |
| 2003/0126566 A1* | 7/2003 | Saito ............................... 716/4 |
| 2004/0136582 A1* | 7/2004 | Bacus et al. .................. 382/128 |
| 2006/0045388 A1* | 3/2006 | Zeineh et al. ................. 382/312 |
| 2006/0215038 A1* | 9/2006 | Gruber et al. ............... 348/218.1 |
| 2006/0284081 A1* | 12/2006 | Miyamoto et al. ............ 250/307 |
| 2006/0288325 A1* | 12/2006 | Miyamoto et al. .............. 716/19 |
| 2007/0120056 A1 | 5/2007 | Nagatomo et al. |
| 2007/0194236 A1 | 8/2007 | Takane et al. |
| 2007/0210252 A1* | 9/2007 | Miyamoto et al. ............ 250/310 |
| 2008/0159609 A1 | 7/2008 | Miyamoto et al. |
| 2010/0119144 A1* | 5/2010 | Kulkarni et al. .............. 382/149 |

FOREIGN PATENT DOCUMENTS

| | | |
|---|---|---|
| JP | 2007-3212 | 1/2007 |
| JP | 2007-147366 | 6/2007 |
| JP | 2007-184283 | 7/2007 |
| JP | 2007-250528 | 9/2007 |
| JP | 2008-147143 | 6/2008 |

* cited by examiner

FIG. 2
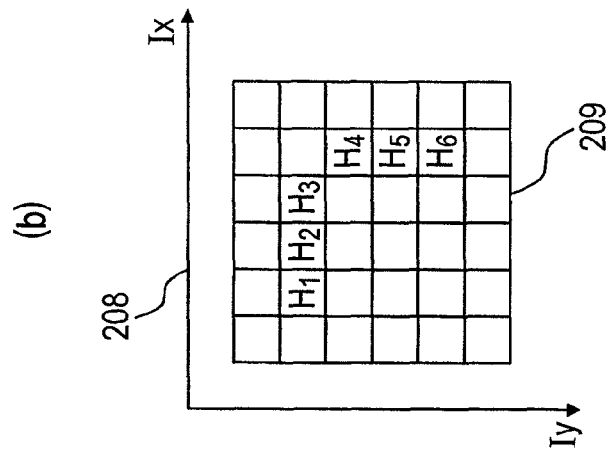
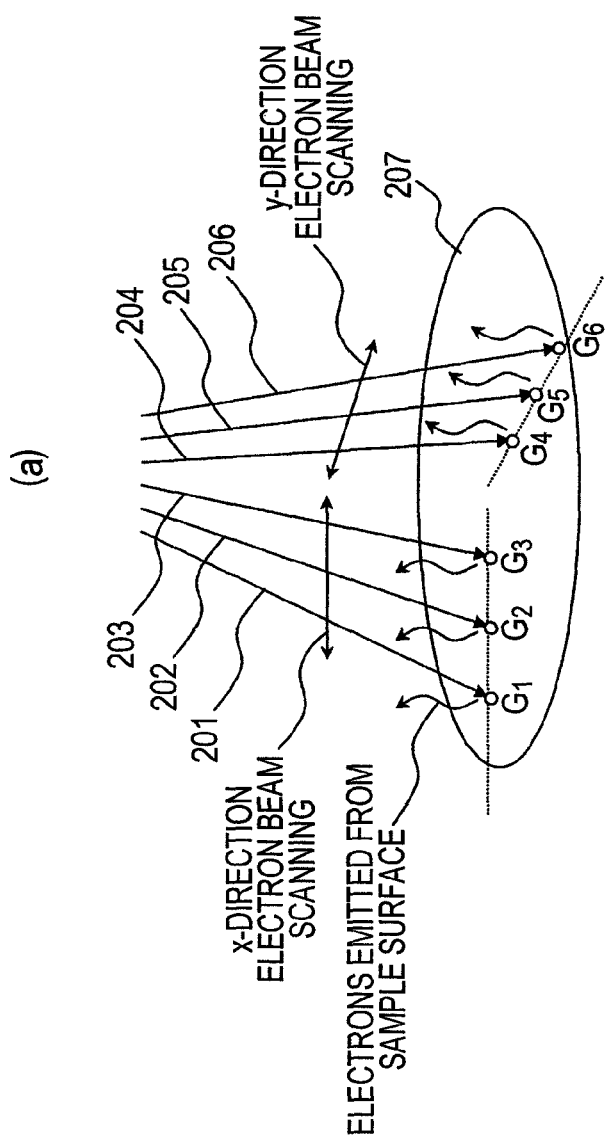

FIG. 8
(a)
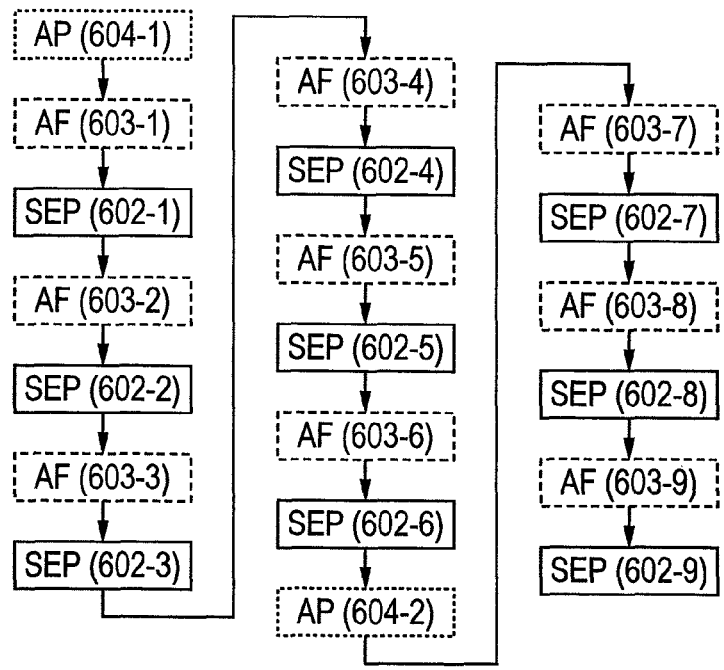
(b)
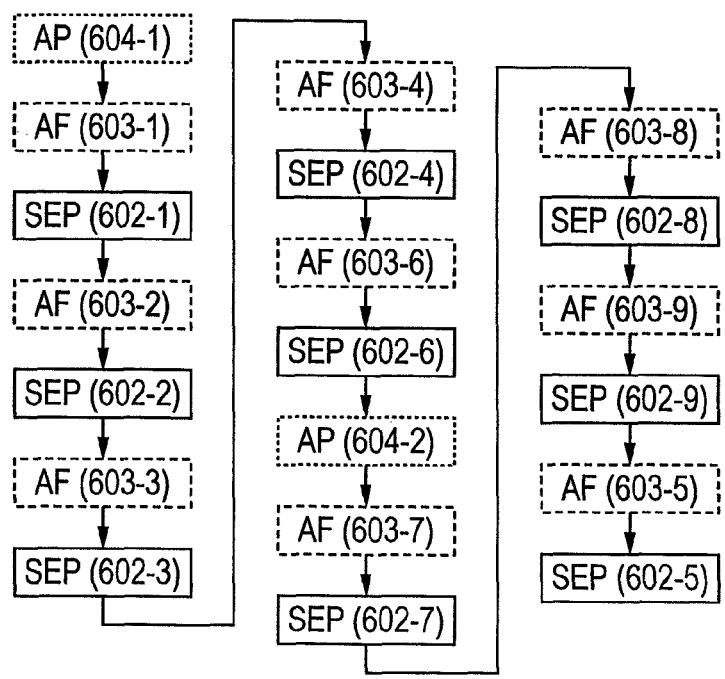

METHOD AND DEVICE FOR SYNTHESIZING PANORAMA IMAGE USING SCANNING CHARGED-PARTICLE MICROSCOPE

TECHNICAL FIELD

This invention relates to a method and a device for generating a panorama image that is robust against contamination due to charged-particle irradiation and the imaging shift and distortion of an image by splitting an imaging region into a plurality of local imaging regions, imaging the same, and stitching the picked-up images of the local imaging regions by image processing in order to obtain a wide-field and high-resolution image using a scanning charged-particle microscope.

BACKGROUND ART

In forming a wiring pattern on a semiconductor wafer, a method is adopted in which coating material called resist is applied on the semiconductor wafer, an exposure mask (a reticle) of a wiring pattern is superposed on the resist, a visible light ray, ultraviolet rays or an electron beam is applied thereto from above, the resist is photo-sensed (exposed) and developed to thereby form the wiring pattern on the semiconductor wafer, and with this wiring pattern of the resist as a mask, the semiconductor wafer is etched to thereby form the wiring pattern.

In inspecting the mask and the pattern shape on the wafer, a critical dimension scanning electron microscope: (CD-SEM), which is a scanning charged-particle microscope, is widely used. The coordinates for performing SEM imaging for evaluating the pattern shape are called an evaluation point, and hereinafter called EP (Evaluation Point) for short. In order to image the EP with a small imaging shift amount and also with high image quality, some or all of adjustment points out of an addressing point (hereinafter referred to as AP), an auto focus point (hereinafter referred to as AF), an auto stigma point (hereinafter referred to as AST) or an auto brightness and contrast point (hereinafter referred to as ABCC) are set as needed, and at the respective adjustment points, addressing, auto focusing, auto stigma adjustment and auto brightness and contrast adjustment are performed, and then the EP is imaged. As to the imaging shift amount in the above addressing, matching between an SEM image at the AP registered in advance as a registered template, whose coordinates are already known, and an SEM image actually observed in the imaging sequence is performed, a shift amount in the matching is taken as a shifting amount of the imaging position, and corrected. The evaluation point (EP), and the adjustment points (AP, AF, AST, ABCC) are collectively called the imaging point. The size and coordinates and the imaging conditions of the EP, the imaging conditions and adjusting methods of the respective adjustment points and the imaging order (or the adjusting sequence) of the respective imaging points, and the above registered template are managed as an imaging recipe, and the SEM images the EP according to the imaging recipe.

The recipe has been manually generated heretofore by an SEM operator, so the labor and time are required. Further, in order to decide the respective adjustment points and register the registered template in the recipe, it is necessary to actually image the wafer at a low power, resulting in that the generation of a recipe is one of the causes of lowering the operating ratio of the SEM apparatus. Further, with the development to the microstructure and the complicatedness of a pattern, the number of points requiring evaluation remarkably increases, so that the manual generation of the recipe is becoming unrealistic from a viewpoint of labor and generation time.

Therefore, concerning the imaging recipe, for example, a semiconductor inspection system is disclosed in which the AP is determined based on design data on a circuit pattern of a semiconductor described in the GDS II form, and further data in the AP is picked from the design data and registered as the registered template in the imaging recipe (Patent Literature 1: JP-A No. 2002-328015 official gazette). In that system, it is not necessary to image an actual wafer only for the purpose of deciding the AP and registering the registered template, so that the improvement in operating ratio of the SEM can be achieved. Further, the system has such a function that when an SEM image at the AP (an actual imaging template) is obtained in the actual imaging sequence, matching between the actual imaging template and the registered template of design data is performed, and an SEM image corresponding to the position of the registered template of the design data is re-registered as the registered template in the imaging recipe, and hereinafter the registered template of the re-registered SEM image is used for the addressing processing. Further, the system has a function of automatically detecting a characteristic pattern part from the design data, and registering the same as the AP.

As the EP, cited are a designation point from a user and a critical portion where device failure is liable to occur called a hot spot output from an EDA (Electronic Design Automation) tool or the like, and feedback such as shape correction for a mask pattern and an alteration of the semiconductor manufacturing process condition is performed based on the pattern dimensional values at these EPs to thereby achieve a high yield. The wiring pattern has been advanced to microstructure and high densification to meet the recent needs of high speed and high integration of the semiconductor device, and super-resolution exposure technique represented by Optical Proximity Correction (OPC) has been introduced. With this introduction, the mask pattern becomes complicated so that simulation prediction for a pattern shape transferred on a wafer and inspection for the actually transferred pattern shape become more important.

[Patent Literature 1] JP-A No. 2002-328015 official gazette

DISCLOSURE OF THE INVENTION

Technical Problem

Although it is necessary to input the pattern shape on the mask for simulation prediction of the pattern shape transferred on the wafer, in order to perform simulation tempering the optical proximity effect, it is necessary to input the pattern shape in a wide range to a certain extent. Although a method of inputting design data as the pattern shape is considered, there is a distance between the design data and the pattern shape actually generated on the mask, and this separation becomes a simulation error. Then, although it is considered to image a pattern generated on the mask by SEM and extract the shape, when imaging is performed at a low magnification to cover the wide range, the resolution of an image is deteriorated. On the contrary, when imaging is performed at a high magnification, although the resolution is improved, the visual field is narrowed. Therefore, it is considered that a wide-field imaging region (a wide range for performing SEM imaging at a high magnification is an evaluation point: EP) is split into a plurality of local imaging regions, and SEM imaged at a high magnification (high resolution), and the split images picked up at a high magnification (high resolution) of the plurality of local imaging regions are stitched by image processing to thereby generate a wide-field and high-resolution panorama image. The split local imaging regions at a high magnification (high resolution) are the split imaging regions of the EP, so the regions are hereinafter referred to as SEP (Segmental Evaluation Point). Generally, panorama image synthesis is well-known processing, and in contrast to the panorama synthesis of images picked up by a CCD camera or the like, for example, the panorama image synthesis processing for the semiconductor pattern using the SEM has peculiar problems.

One is a problem of adhesion of contamination on a sample due to the irradiation of an electron beam. That is, in the case of performing SEM imaging twice for the same place, in the second SEM image, influence of contamination is more strongly exerted to occasionally cause a phenomenon that in contrast to the first SEM image, the image is darkened or a line width of a pattern changes. Consequently, the problem is encountered that in the finally obtained panorama image, the degree of contamination varies from place to place, and the accuracy of pattern shape on the image deteriorates.

Further, in observing a fine semiconductor pattern, imaging should be performed at high magnification (high resolution) as much as tens of thousands of magnification to hundreds of thousands of magnification extending over a wide-field (wide range) imaging region (EP). Then imaging shift between the SEPs and very small distortion of an image are also problems in the panorama synthesis processing.

It is an object of the invention to provide a method and a device for synthesizing a panorama image using a scanning charged-particle microscope in order to solve the above problems, which may obtain a panorama image synthesis that is robust against contamination and the imaging shift and distortion of an image based on a split high-resolution SEP group in a wide-field imaging region EP to a fine semiconductor pattern.

Solution to Problem

In order to solve the problems, the invention has achieved a panorama image synthesis technique that is robust against contamination and the imaging shift and distortion of an image based on a split high-resolution SEP group in a wide range image (a wide-field image) using a scanning charged-particle microscope (SEM).

(1) That is, it is necessary to set an adjustment point in order to image the SEP with a small imaging shift amount and with high image quality, and since a plurality of SEPs adjoin each other in a panorama image, sometimes the adjustment point for a certain SEP cannot be arranged when overlapping of an imaging region with a second SEP is not allowed. However, when the above second SEP is imaged after imaging the adjustment point for a certain SEP overlapping the above second SEP, contamination due to imaging of the overlapping adjustment point occurs in the image of the second SEP, resulting in affecting the measurement accuracy of the observed pattern shape. On the other hand, various kinds of adjustment at the adjustment point are comparatively unlikely to be influenced by the contamination.

Accordingly, the invention is characterized in that when an adjustment point for a certain SEP has an overlapping region with a second SEP, the layout of adjustment points and the imaging order of the imaging points (the respective SEPs and the respective adjustment points) are optimized so that the adjustment point for the certain SEP is imaged after imaging the above second SEP and before imaging the certain SEP.

That is, the invention is characterized by including: an imaging recipe creating process, which includes a region deciding step of deciding a wide range (a wide-field) imaging region (evaluation point: EP) on a sample imaged using an SEM, a local region deciding step of splitting the wide-range (the wide-field) imaging region (EP) into a plurality of high magnification local imaging regions (SEP (Segmentation Evaluation Point)) and deciding the same, an adjustment point deciding step of deciding adjustment points for imaging each of the plurality of SEPs (some or all of an addressing point (AP), an auto focus point (AF), an auto stigma point (AST), an auto brightness and contrast point (ABCC), or a magnification adjustment point), and an imaging order deciding step of deciding the imaging order of the respective SEPs and the respective adjustment points, and creates the coordinates (layout) of the respective SEPs and the respective adjustment points and the imaging order of the respective SEPs and the respective adjustment points as an imaging recipe; an imaging process of sequentially imaging each of the plurality of SEPs on the sample using the SEM according to the imaging recipe created in the imaging recipe creating process; and a mosaic process of stitching an SEP image group sequentially imaged in the imaging process by image processing, and generating a panorama image, wherein in the image recipe creating process, when the layout of the adjustment point is decided in such a manner that the imaging region overlaps an optional SEP, in the imaging order deciding step, further the imaging sequence is created as the imaging recipe in such a manner that while the respective local imaging regions except the local imaging regions corresponding to the overlapping adjustment point meet the condition that imaging at the respective local imaging regions is performed immediately after adjusting at the adjustment point for the respective local imaging regions, at the local imaging regions corresponding to the overlapping adjustment point, imaging is performed immediately after adjusting at the overlapping adjustment point after imaging the optional local imaging region.

(2) Further, the invention is characterized in that some or all of (a) splitting into the plurality of SEPs (decision on the number, size and coordinates of SEPs), (b) decision on the layout of the respective adjustment points corresponding to the respective SEPs, and (c) decision on the imaging order of the imaging points (the respective SEPs and the respective adjustment points) described in the (1) are performed according to the design data on a circuit pattern formed on the sample.

In order to decide the items (a) to (c), it should be known that what pattern exists at least in the imaging region of the EP (Evaluation Point). Further it is considered to arrange the adjustment points in the periphery of the EP in a region where visual field can be moved by image shift. In that case, it is necessary to know the pattern information on the EP and its periphery. For example, it is considered that the pattern of the EP and its periphery is once imaged at low magnification to obtain a pattern array. However, it has the problems of low resolving power, requiring the imaging time, and causing some contamination. The invention is characterized in that the pattern information is acquired off-line (without an imaging device) using the design data. Further, as described above, in deciding the SEP and the imaging sequence (the coordinates and the imaging order of the imaging points; widely, the size, imaging conditions and adjustment method of the imaging points are also included), there are a number of items to be evaluated, so manual optimization requires much time. Therefore, the SEP and the imaging sequence can be automatically decided by analyzing the design data using software.

(3) Further the invention is characterized in that in deciding the SEP, a plurality of SEPs are decided so that there is an overlapping region between the adjoining SEPs, and an edge of a pattern which is a key to deciding the alignment amount between the SEPs or the distortion correction amount of an image is included in the overlapping region. Further the invention is characterized in that in evaluating whether or not the edge of the pattern is included in the overlapping region, an estimated imaging shift amount in imaging the SEP is input, and only the edge of the pattern, which is not out of the overlapping region even when an imaging shift for the estimated imaging shift amount occurs, is evaluated.

That is, in order to obtain a seamless panorama image by correcting the imaging shift occurring in imaging the SEP, the stitching processing (the mosaic processing) for the SEP images is performed using the pattern included in the overlapping region between the SEPs. Therefore, although the SEPs are set depending on whether or not the pattern suitable for the stitching processing exists in the overlapping region, the pattern, which should have been included in the overlapping region, is out of the overlapping region due to the imaging shift in imaging the SEPs, resulting in the risk of causing failure in the stitching processing. Therefore, in deciding the SEP, an estimated imaging shift amount is input in advance, and only the pattern, which is not out of the overlapping region even when the estimated imaging shift amount occurs, is evaluated to thereby achieve a panorama synthesis processing that is robust against the imaging shift.

(4) Further the invention is characterized in that in the SEP deciding step, the SEP is decided on the basis of the edge of a pattern included in the overlapping region between the SEPs, the layout of the respective adjustment points and the imaging order of the imaging points (the respective SEPs and the respective adjustment points).

Generally after deciding the SEP, which is a region to be imaged, the adjustment points for favorably imaging the SEP are set. A panorama image is, however, dense with a plurality of SEPs so that it is sometimes difficult to set the adjustment points not to cause contamination at the given SEPs. Therefore, it is characterized in that not first deciding the SEP but a plurality of SEPs are decided to fill up the EP while tempering whether the layout and combination for the imaging order of the adjustment points including the edge of a pattern advantageous to the stitching processing in the overlapping region and also not causing contamination exist.

(5) Further the invention is characterized in that the imaging positions of the plurality of local imaging regions (SEP) are distributed to the coordinates on a plurality of cells or a plurality of chips having the same pattern structure.

Since the overlapping region between the SEPs is imaged at least twice, the influence of contamination becomes greater especially in the second imaging. Further, as described above, the panorama image is dense with the plurality of SEPs, so that it is sometimes difficult to set the adjustment points not to cause contamination on the SEPs. Then, according to the invention, the imaging positions of the SEPs are distributed to the plurality of cells or chips and imaged by utilizing the repetition of a circuit pattern between the cells or the chips, thereby reducing the influence of contamination and also giving a number of alternatives in setting the SEPs and the adjustment points.

(6) Further the invention is characterized in that imaging of the local imaging regions (SEP) and generation of a panorama image are performed on the plurality of cells or the plurality of chips having the same pattern structure to thereby generate a plurality of panorama images.

Further the invention is characterized in that a contour line group is calculated from the obtained panorama image group, and an average contour line is calculated from the contour line group. The average contour line group may equalize shape variation due to edge roughness or the like so as to obtain contour line information with less variation.

(7) Further the invention is characterized in that the layout (the stitching positions) of the SEPs for generating each of the plurality of panorama images described in (6) varies with every panorama image.

Further, the invention is characterized in that a contour line group is calculated from the obtained panorama image group, and an average contour line is calculated from the contour line group. As to the accuracy of the contour line at the stitching position (the overlapping region) between the SEPs, there is a high risk of lowering the detection accuracy as compared with the contour at the other portions due to the problems of degree of contamination and the stitching accuracy. Since the average contour line is the average of a group of panorama images different in stitching position (overlapping region) between the SEPs, shape errors of the contour lines generated at the stitching parts are equalized so as to obtain contour line information with less variation. The average contour line generated in the (6) and (7) may use the average value of coordinates of the plurality of contour lines corresponding thereto, or after the contour lines having low reliability (for example, the contour lines calculated from the overlapping region) are excluded, the average is taken. There may be a variation in taking the average.

Advantageous Effects of the Invention

According to the invention, it is possible to obtain a panorama image synthesis that is robust against contamination and the imaging shift and distortion of an image. Further according to the invention, since the obtained panorama image has wide-field and high resolution, a pattern shape error in the stitching region between the SEPs can be restrained.

BRIEF DESCRIPTION OF THE DRAWINGS

FIGS. 2(a) and 2(b) are diagrams showing a method of imaging the signal amount of an electron emitted from the upside of a semiconductor wafer in the SEM device according to the invention.

FIG. 8(a) is a diagram showing a comparative example of an imaging sequence according to the invention, and FIG. 8(b) is a diagram showing one embodiment in which the imaging sequence is optimized according to the invention in the panorama image synthesis in which the plurality of SEPs and the plurality of adjustment points are arranged as shown in FIG. 7.

FIGS. 15(a) and 15(b) are diagrams showing embodiments of split SEPs having different overlapping regions, 15(c) is showing the condition where 15(a) and 15(b) are superposed one on the other at the corresponding coordinates, and 15(d) is a diagram showing an embodiment in which the distribution of the SEPs described using FIG. 12 and FIG. 13 and the generation of the plurality of panorama images described using FIG. 14 and FIG. 15 are combined.

MODE FOR CARRYING OUT THE INVENTION

This invention provides a method and a device for synthesizing a panorama image using a scanning charged-particle microscope, which may obtain an image (a wide-field image) in a wide imaging region (EP) using a scanning charged-particle microscope (SEM) for observing a fine semiconductor pattern using a panorama image synthesis technique that is robust against contamination and the imaging shift and distortion of an image with high-resolution (high magnification as much as tens of thousands of times to hundreds of thousands of times). The embodiments of the invention will now be described concerning the case of application to the scanning electron microscope (SEM).

1. SEM
1.1 SEM Components

Figure 1:
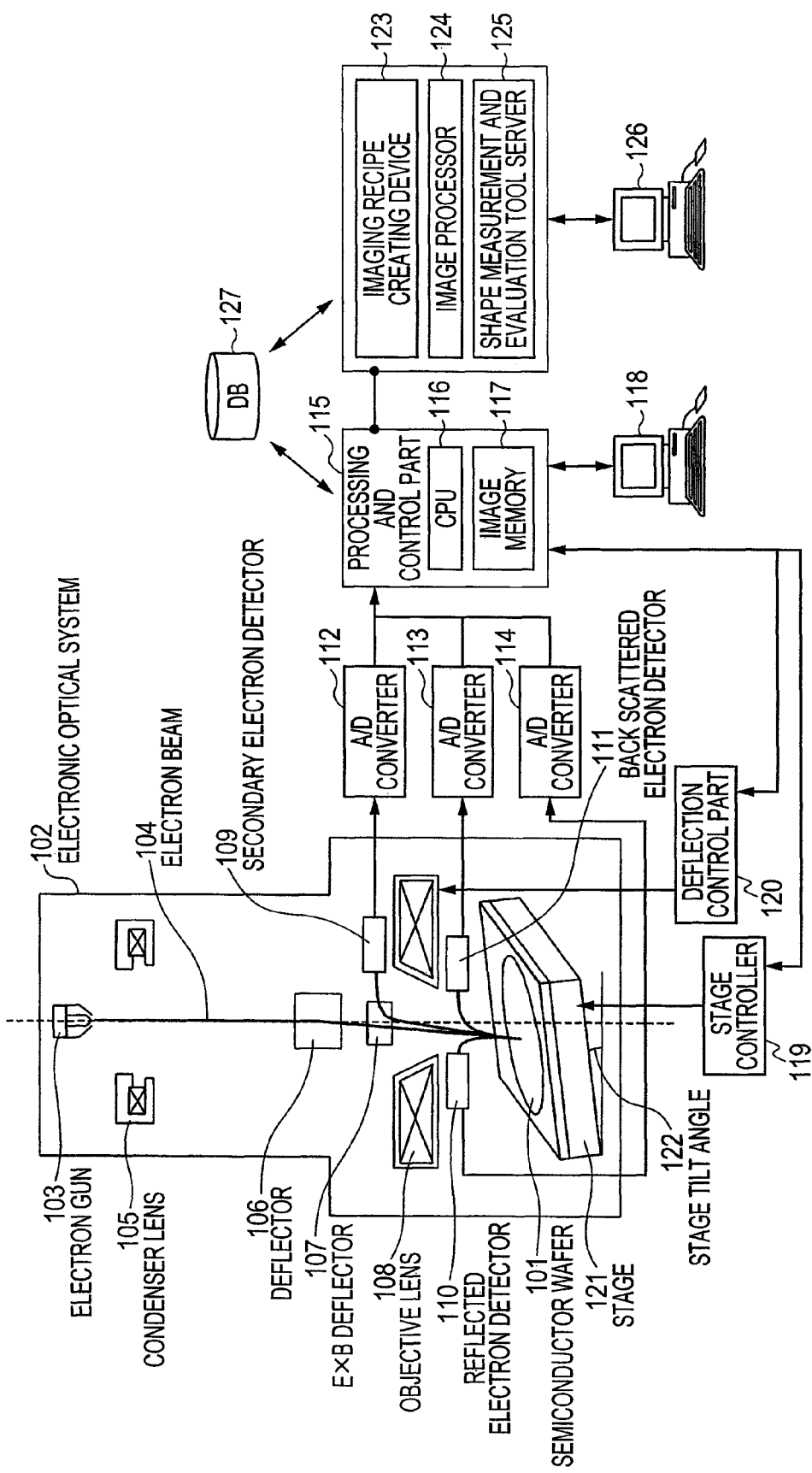
FIG. 1 is a block diagram showing one embodiment of an SEM device used in panorama image synthesis according to the invention.

FIG. 1 shows a block diagram of a configuration outline of the SEM for obtaining a secondary electron image (SE image) or a back scattered electron image (BSE image). The SE image and the BSE image are collectively called an SEM image. Further, the image obtained here includes part or whole of a top down image obtained by applying an electron beam to a measuring object from the vertical direction, or a tilt image obtained by applying an electron beam from the direction of an optional angle of inclination.

An electron optical system 102 includes an electron gun 103 in the interior, which generates an electron beam 104. The irradiating position of an electron beam and a diaphragm are controlled by a deflector 106 and an objective lens 108 so that after the electron beam 104 emitted from the electron gun 103 is narrowed down by a condenser lens 105, the electron beam is applied and focused to meet at an optional position on a semiconductor wafer 101 which is a sample placed on a stage 121. A secondary electron and a back scattered electron are emitted from the semiconductor wafer 101 to which the electron beam 104 is applied, and the secondary electron separated from the orbit of an irradiating electron beam by an E×B deflector 107 is detected by a secondary electron detector 109. On the other hand, the back scattered electron is detected by back scattered electron detectors 110 and 111. The back scattered electron detectors 110 and 111 are installed in the directions different from each other. The secondary electron and back scattered electron detected by the secondary electron detector 109 and the back scattered electron detectors 110 and 111 are converted to digital signals by A/D converters 112, 113, 114, input to a processing and control part 115, stored in an image memory 117 and subjected to image processing according to an intended purpose by a CPU 116.

FIG. 2 shows a method of imaging a signal amount of electrons emitted from the upside of the semiconductor wafer. The electron beam is, for example, as shown in FIG. 2(a), scanned in the x and y directions and radiated as indicated by 201 to 203 or 204 to 206. The scanning direction can be varied by changing the deflection direction of the electron beam. Places on the semiconductor wafer irradiated by the electron beams 201 to 203 scanned in the x-direction are respectively indicated by G1 to G3. Similarly places on the semiconductor wafer irradiated by the electron beams 204 to 206 scanned in the y-direction are respectively indicated by G4 to G6. The signal amounts of electrons emitted at the G1 to G6 are respectively brightness values of pixels H1 to H6 in an image 209 shown in FIG. 2(b) (suffixes 1 to 6 in G and H correspond to each other). The reference numeral 208 is a coordinate system indicating the x and y directions on an image. An image frame 209 can be obtained by scanning the interior of the visual field with the electron beam as described. Actually the interior of the visual field is scanned several times according to the same procedure, and the obtained image frames are added and averaged to thereby obtain an image at high S/N ratio. The number of added frames can be set optionally.

The processing and control part 115 in FIG. 1 is a computer system including the CPU 116 and the image memory 117, which performs the processing and control for sending a control signal to a stage controller 119 and a deflection control part 120 to image an imaging point based on an imaging recipe, or conducting various kinds of image processing to a picked-up image at an optional imaging point on the semiconductor wafer 101.

The imaging point here in this case includes adjustment points (including some or all of an addressing point (hereinafter referred to as AP), an auto focus point (hereinafter referred to as AF), an auto stigma point (hereinafter referred to as AST), an auto brightness and contrast point (hereinafter referred to as ABCC) and a magnification adjustment point), and a plurality of local imaging regions (hereinafter referred to as SEP) for splitting a wide-range imaging region (a wide range for performing SEM imaging at a high magnification is an evaluation point: EP) and SEM imaging at a high magnification (high resolution). The processing and control part 115 is connected to a processing terminal 118 (including input/output means such as a display, a keyboard and a mouse), and provided with a GUI (Graphic User Interface) for displaying an image or the like to a user, or receiving input from the user. The reference numeral 121 is an XY stage, which moves the semiconductor wafer 101 to enable picking-up of an image at an optional position of the semiconductor wafer. The change of the imaging position using the XY stage 121 is called stage shift, and for example, the change of the observation position by deflecting the electron beam using the deflector 106 is called image shift. Generally the stage shift has a wide movable range, but low positioning accuracy of the imaging position, and on the contrary, the image shift has a narrow movable range, but high positioning accuracy of the imaging position.

Although the embodiment including two detectors 110, 111 for the back scattered electron beam is shown in FIG. 1, it is possible to eliminate the detector for the back scattered electron beam, decrease the number of the detectors or increase the number of the detectors. As a method of obtaining a tilt image from a measuring object observed from an optional angle of inclination using the device shown in FIG. 1, cited are (1) a method in which the electron beam 104 irradiated from an electronic optical system 102 is deflected, the irradiation angle of the electron beam 104 is inclined to image an inclined image (e.g. JP-A No. 2000-348658 official gazette), (2) method in which the stage 121 itself for moving the semiconductor wafer is inclined (the stage is inclined at a tilt angle 122 in FIG. 1), and (3) a method in which the electronic optical system is mechanically inclined.

In an imaging recipe creating device 123, according to a method mentioned later, an imaging recipe for deciding a plurality of segmental evaluation points (SEP) obtained by splitting a wide region (a wide-field) evaluation point (EP) and SEM imaged at high magnification (high resolution) is created, and the SEM device is controlled based on the created imaging recipe to perform imaging. The size and coordinates of the SEP, imaging condition, an imaging sequence for imaging the SEPs (the coordinates and imaging order of imaging points; widely, including the size of the imaging point, imaging condition and an adjustment method) and information of a register template concerning the adjustment point such as AP are written in the imaging recipe. An image processor 124 conducts the panorama image synthesis processing using the plurality of imaged SEP images and the contour line extract processing for a circuit pattern from the panorama image. In the shape measurement and evaluation tool server 125, shape measurement and shape evaluation using the panorama image and the contour line are performed. The reference numerals 123, 124, 125 are connected to the processing terminal 126 (including input/output means such as a display, a keyboard and a mouse), and provided with a GUI (Graphic User Interface) for displays the processing result and the like to the user, or receiving input from the user. The reference numeral 127 is a storage, which stores a database of design layout information (hereinafter referred to as design data) of a semiconductor circuit pattern, and the information such as imaged SEP image, generated panorama image, contour line, shape measurement and evaluation result, and imaging recipe can be saved and shared in the database. The processing conducted in the 115, 123, 124 and 125 can be optionally combined and divided to two or more devices or integrated and processed.

The imaging recipe creating device 123 according to the invention includes: region deciding means for performing a region deciding step; segment evaluation point deciding means for performing a segment evaluation point deciding step; adjustment point deciding means for performing an adjustment point deciding step; and imaging sequence deciding means for performing an imaging sequence deciding step.

1.2 System Configuration

Figure 3:
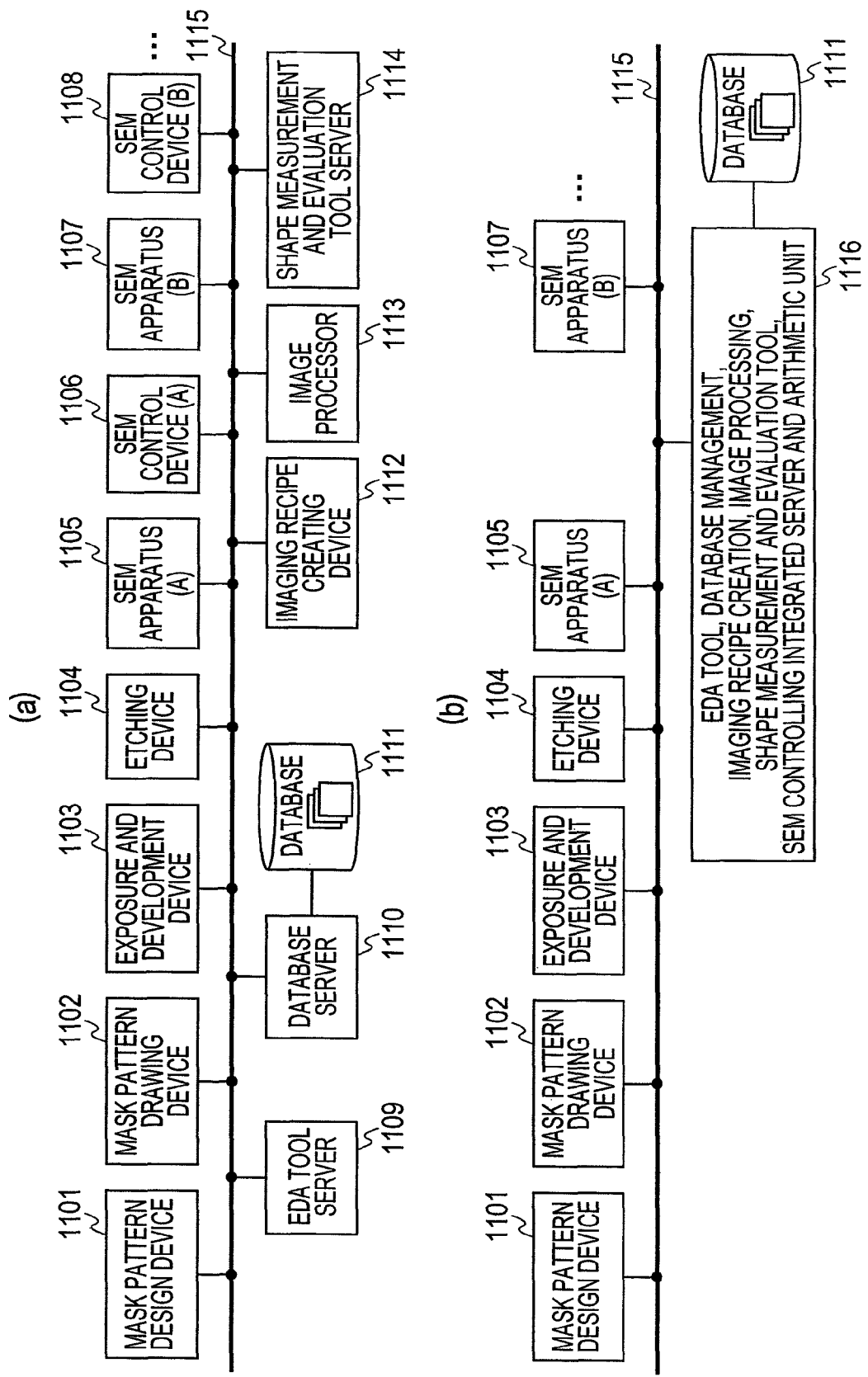
FIGS. 3(a) and 3(b) are block diagrams respectively showing one embodiment of an apparatus system used in panorama image synthesis according to the invention.

An embodiment of system configuration according to the invention will be described using FIG. 3. In FIG. 3(*a*), the reference numeral 1101 is a mask pattern design device, 1102 is a mask pattern drawing device, 1103 is an exposure and development device of a mask pattern onto a wafer, 1104 is an etching device for the wafer, 1105 and 1107 are SEM devices described in FIG. 1 and FIG. 2, 1106 and 1108 are SEM control devices respectively controlling the SEM devices, 1109 is an EDA (Electronic Design Automation) tool server, 1110 is a database server, 1111 is a storage storing a database similarly to the 127, 1112 is an imaging recipe creating device similarly to the 123, 1113 is an image processor similarly to the 124, 1114 is a measurement and evaluation tool server for a generated pattern shape similarly to the 125, and these are capable of transmitting and receiving information through a network 1115. The storage 1111 is fitted to the database server 1110, thereby storing and referring some or all of (a) size and coordinates of the EP, (b) design data (mask design data (without/with OPC), wafer transfer pattern design data), (c) imaging recipe generation rule, (d) generated imaging recipe (including Sep and imaging sequence), (e) imaged and generated image (SEP image, panorama image), (f) contour line extracted from an image, (g) simulation pattern, and (h) measurement and evaluation result linking with type, by linking with manufacturing process, date and a data acquiring device and the like, or referring to the same. Although two SEM devices 1105, 1107 are connected to the network as the embodiment in this drawing, in the invention, the imaging recipe can be shared between optional two or more SEM devices by the database server 1111, and the two or more SEM devices can be operated by one time imaging recipe creation. Further, the database is shared by the two or more SEM devices, whereby the past success or failure in imaging or measurement and causes of failure can be accumulated quickly so that referring to this can contribute to favorable imaging recipe generation.

FIG. 3(*b*) is a diagram where the 1106, 1108, 1109, 11, 10, 1112 to 1114 in FIG. 3(*a*) are integrated into one device 1116 as one embodiment. As in the present embodiment, optional functions can be divided to optional two or more devices or integrated to conduct the processing.

1.3. SEM Imaging Sequence

Concerning imaging the SEP using the SEM, an embodiment of a typical imaging sequence (the coordinates and the imaging order of imaging points) including imaging of the adjustment points (including some or all of AP, AF, AST, ABCC or magnification adjustment point) shown in FIG. 4(*a*) will be described.

Figure 4:
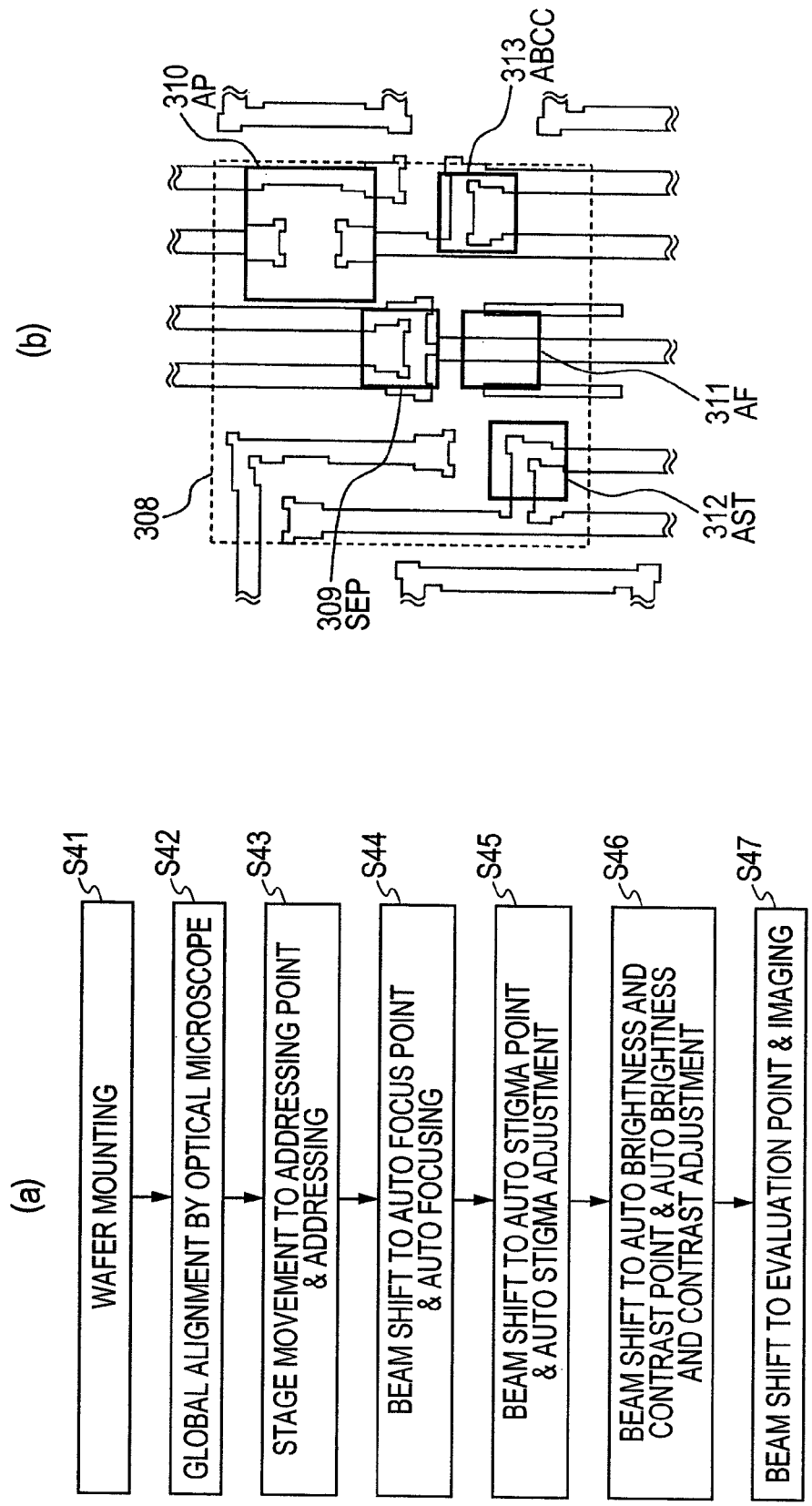
FIG. 4(a) is a diagram showing one embodiment of an imaging sequence of the SEM device according to the invention.
FIG. 4(b) is a diagram showing one embodiment of an adjustment point arranged on an image shift enabling region from an SEP according to the invention.

First, in the step S41 of FIG. 4(*a*), a semiconductor wafer as a sample is mounted on the stage 121 of the SEM device. In the step S42, an origin shifting of the wafer and rotation of the wafer are corrected by observing a global alignment mark on the wafer.

In the step S43, the stage 121 is moved based on the processing and control of the processing and control part 115, the imaging position is moved to the AP to perform imaging, and a parameter of addressing is obtained to perform addressing based on the obtained parameter. Addressing will be described in here. In the case of observing the SEP, when the SEP is directly observed by stage shift, there is the risk that the imaging position is largely shifted depending on the positioning accuracy of the stage. Therefore in this embodiment, the AP, to which the coordinate values of the imaging point and template (pattern of an imaging point, the data form may be SEM image or design data) are once given in advance for positioning, is observed by stage shift. Since the template is registered in the imaging recipe, hereinafter it is referred to as a registered template. The AP is selected from the peripheral region (movable region by image shift) of the SEP. Further, since the AP is generally a low magnification visual field as compared with the SEP, the risk that all of patterns in the registered template are out of the visual field is low even for just a little shifting of the imaging position. Then the registered template of the AP is matched with the SEM image of the actually imaged AP, whereby the imaging shift amount of the imaging point at the AP can be estimated. The coordinate values of the AP and the SEP are registered in the database 127 and already known, so that the relative displacement vector between the AP and the SEP can be obtained, and also the imaging shift amount of the imaging point at the AP can be also estimated by the above matching. Thus, the relative displacement vector from the AP imaging position to be actually moved to the SEP can be found by subtracting the imaging shift amount from the above relative displacement amount. The SEP can be imaged with high coordinate accuracy by controlling a scanning area of an electron beam without moving the stage to shift the imaging area with high positional accuracy for the relative displacement vector.

Subsequently, in the step S44, the imaging position is moved to the AF by image shift based on the processing and control of the processing and control part 115 to perform imaging, and a parameter of auto focusing is obtained to perform auto focusing based on the obtained parameter. Although the auto focus processing for clearly imaging the SEP is performed in the step S44 in the flowchart of FIG. 4(*a*), it may be varied so that AF for similarly clearly imaging the AP is set before the step S43 and the auto focus processing using the AF is performed before imaging the AP or the like (the same will be said with AST and ABCC mentioned later).

Subsequently, in the step S45, the imaging position is moved to the AST by image shift to perform imaging based on the processing and control of the processing control part 115, and a parameter of an auto stigma adjustment (astigmatism) is obtained to perform auto stigma adjustment based on the obtained parameter.

Subsequently, in the step S46, the imaging position is moved to the ABCC by image shift to perform imaging based on the processing and control of the processing and control part 115, and a parameter of brightness and contrast adjustment is obtained to perform auto brightness and contrast adjustment based on the obtained parameter (in order to obtain a clear image having suitable brightness value and contrast in imaging the SEP, for example, a parameter such as a voltage value of a photomultiplier tube in the secondary electron detector 109 is adjusted, thereby adjusting so that the highest part and the lowest part of an image signal have full contrast or contrast close thereto). Then, in the step S47, the imaging point is moved to the SEP by image shift to perform imaging.

FIG. 4(*b*) illustrates one embodiment of layout of AP310, AF311, AST312 and ABCC313 on an image shift enabling region 308 from the SEP 309. The following variations may be caused: some or all of the steps S43, S44, S45, S46 are eliminated in some cases, the steps S43, S44, S45, S46 optionally exchange places with each other in the order, or some of the AP, AF, AST and ABCC overlap at the coordinates (e.g. the auto focus and auto stigma are performed at the same point).

2. Panorama Image Synthesis Processing Flow

Figure 5:
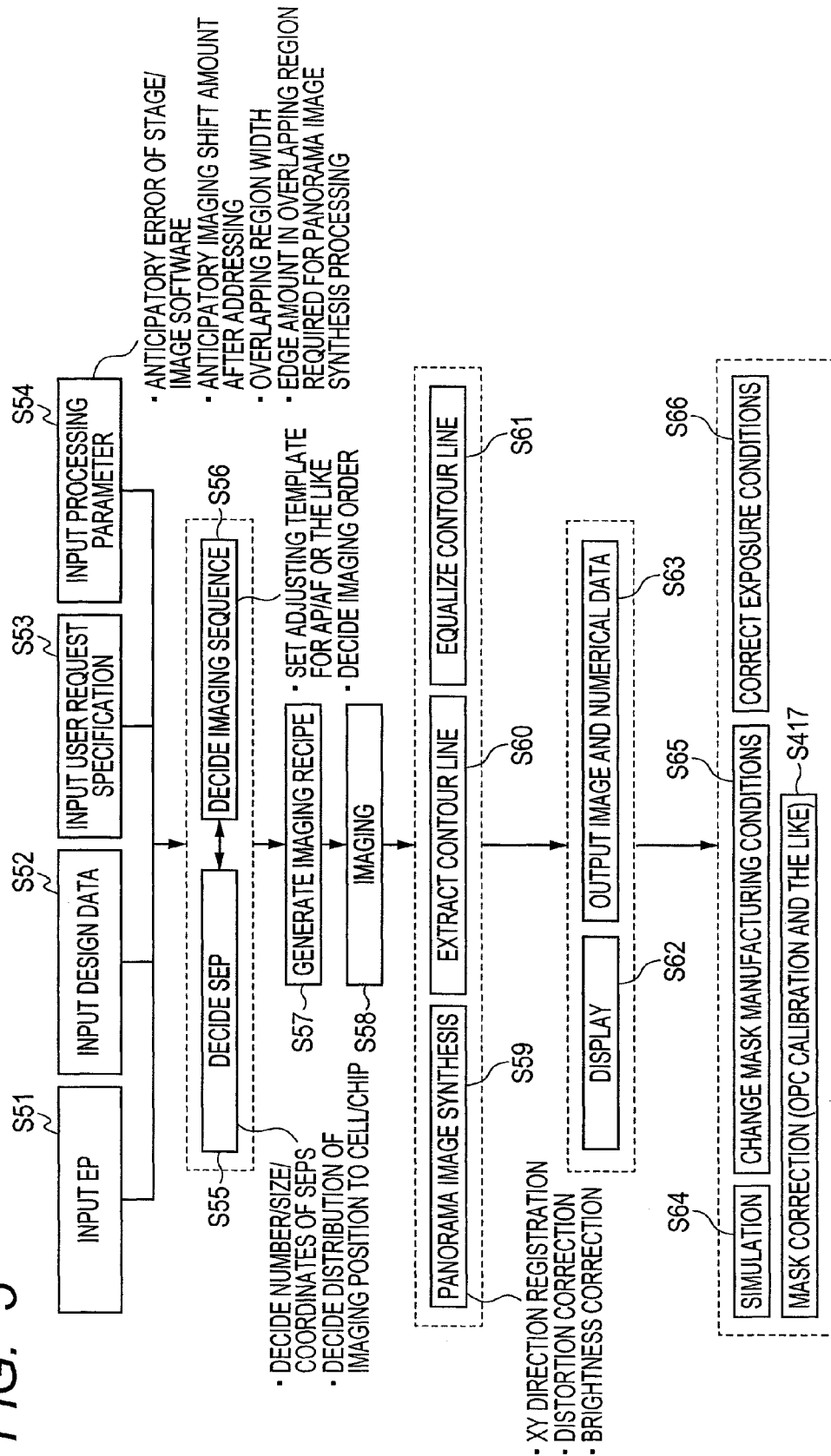
FIG. 5 is a diagram showing one embodiment of a flow of the whole processing in the panorama image synthesis according to the invention.

The panorama image synthesis processing flow that is robust against contamination and the imaging shift and distortion of an image according to the invention will be described using FIG. 5.

2.1 Data Input Step

First, the size and the coordinates of the EP and the design data on the semiconductor circuit pattern are input (the steps S51, S52, respectively). The EP is a wide-range imaging region to be obtained, and as to the coordinates of the EP, the coordinates of a hot spot (a danger point) where device failure is liable to occur, which is detected based on the result of exposure simulation or the like performed in the EDA (Electric Design Automation) tool 1109 are input in some cases, or the coordinates are input depending on a user's own decision (referring to the information on the EDA tool 1109 stored in the database 127 (1111) as needed) in some cases. Further, the user request specifications may be input from the processing terminal 126 and the like as needed (step S53). As the user request specification, the followings may be specified: the size and imaging magnification of the SEP having high resolution divided in the EP; the number of SEPs; distribution or not or combination of distribution of SEP imaging positions to cells or chips; and setting or not of AP/AF/AST/ABCC/magnification adjustment point as the adjustment points. A processing parameter may be input as needed (step S54). As the processing parameter, the following may be specified: stage/image shift estimated error; estimated imaging shift amount after addressing; overlapping region width; and edge amount within overlapping region required for panorama image synthesis processing. In this case, all of the information described as specified information in the step S53 and the step S54 is not necessarily specified.

2.2 SEP/Imaging Sequence Estimating and Imaging Recipe Generation Step

Figure 6:
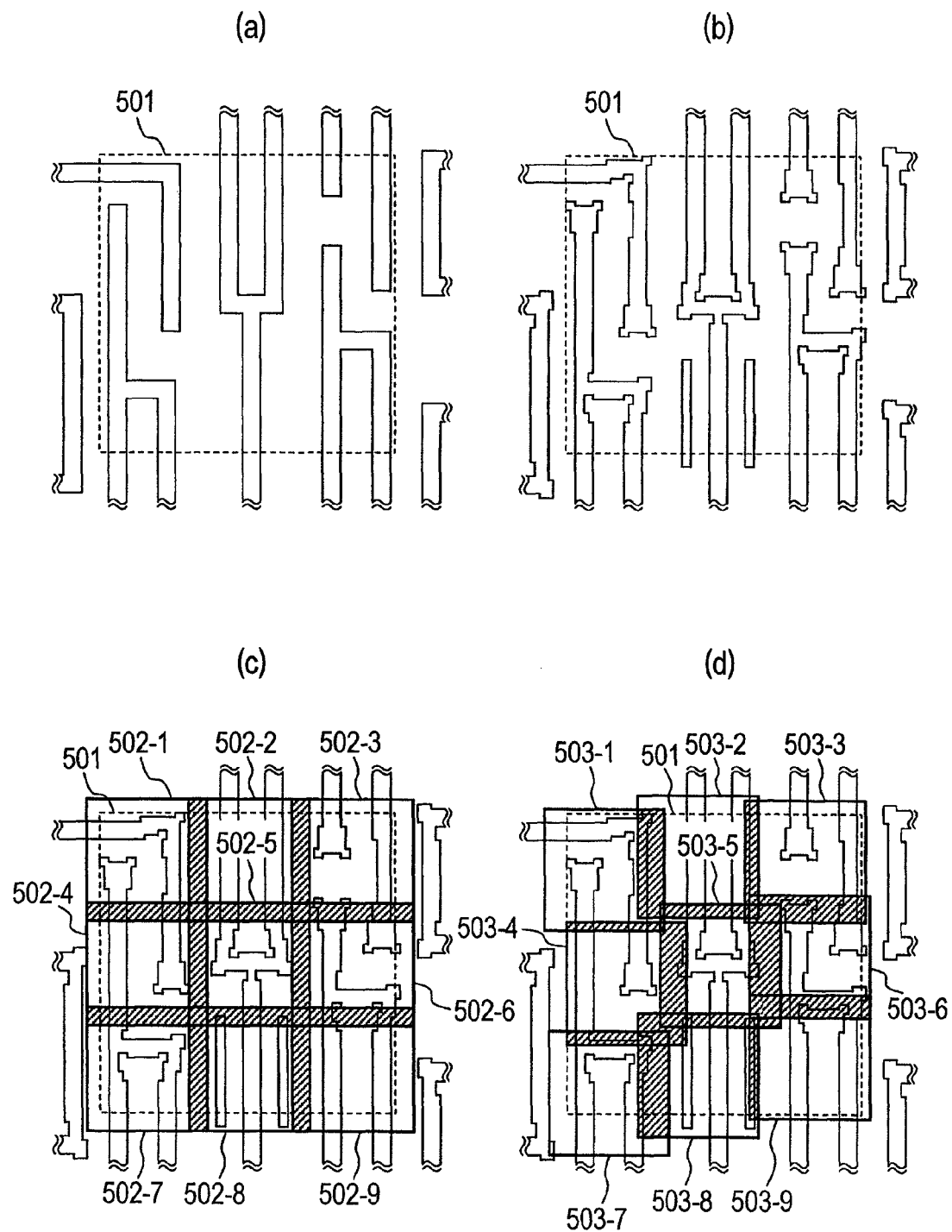
FIG. 6 is a diagram for explaining a method of splitting an evaluation point (EP) into local imaging regions (SEP) according to the invention, (a) is a diagram showing one embodiment indicating part of a mask pattern without OPC, (b) is a diagram showing one embodiment of a pattern to which OPC is conducted, (c) is a diagram showing one embodiment in which a plurality of SEPs are arranged like a grid in a wide EP, and (d) is a diagram showing the case where the plurality of SEPs are decided so that an overlapping region exists between the adjoining SEPs and the edge of a pattern is included in the overlapping region.

The imaging recipe creating devices 123, 1112 (1116) decide the SEP (number, size, coordinates, distribution of SEP imaging positions to cells or chips), the imaging sequence (adjustment template (AP/AF/AST/ABCC), and an imaging order of imaging points (adjusting point and SEP on the basis of the information input in the steps S51, S52, S53, S54 using the terminal devices 126, 118 in the steps S55, S56 while deciding the information not specified in the step S53 and S54 as needed. In the step S55, in deciding the SEPs as shown in FIG. 6(*d*), for example, a plurality of SEPs (503-1) to (503-9) are decided so that there is an overlapping region between the adjoining SEPs and the edge of a pattern, which is a key to deciding the alignment amount between the adjoining SEPs or the distortion amount of an image, is included in the overlapping region.

Thus, whether or not the edge is included in the overlapping region is evaluated by inputting an estimated imaging shift amount in imaging the SEPs, and evaluating only the edge that is not out of the overlapping region even when the imaging shift occurs for the estimated imaging shift amount. That is, the pattern, which should have been included in the overlapping region, is out of the overlapping region due to the imaging shift in imaging the SEPs, resulting in the risk of failure in the stitching processing. Therefore, in the step S55, the imaging recipe creating devices 123, 1112 (1116) achieve the panorama synthesis processing that is robust against the imaging shift in the image processors 124, 1113 (1116) by inputting the estimated shifting amount in advance from the database 127 (1111) acquired from the processing and control part 115 of the SEM and stored and evaluating only the pattern which is not out of the overlapping region even when the estimated imaging shift amount occurs in deciding the SEPs. The imaging recipe creating devices 123, 1112 (1116) can estimate the estimated imaging shift amount on the basis of the stage/image shift estimated error and the estimated imaging shift amount after addressing input from the database 127 (1111) in the step S54, for example. The estimated imaging shift amount after addressing can be estimated on the basis of the AP image imaged in imaging the SEM.

Further, the imaging recipe creating devices 123, 1112 (1116) perform the steps S55, S56 not independently but interactively according to the edge of a pattern included in the overlapping region between the SEPs, the layout of the adjustment points and the imaging order of imaging points. That is, although normally it is considered to set the adjustment points for favorably imaging the SEPs after deciding the SEPs as the region to be imaged, the panorama image of the invention is dense with the plurality of SEPs, and it is often difficult to set the adjustment points not to cause any contamination at the given SEPs. Therefore, the imaging recipe creating devices 123, 1112 (1116) according to the invention are characterized in that the SEPs are not decided in the first, but as shown in the steps S55, S56, the plurality of SEPs are decided to fill up the EP while tempering whether the combination of the layout and the imaging order of the adjustment points including the edge of a pattern advantageous to the stitching processing in the overlapping region and also not causing contamination exists.

Further, the imaging recipe creating devices 123, 1112 (1116) according to the invention are characterized in that the imaging positions of the plurality of SEPs can be distributed to the coordinates on a plurality of cells or a plurality of chips having the same pattern structure on a sample. That is, since the overlapping region between the SEPs is imaged at least twice, the influence of contamination becomes greater especially in the second imaging. As in the invention, the panorama image is dense with the plurality of SEPs, so that it is sometimes difficult to set the adjustment points not to cause contamination on the SEPs. Then, the imaging recipe creating devices 123, 1112 (1116) according to the invention can reduce the influence of contamination and also give a number of alternatives in setting the SEPs and adjustment points by utilizing the repetition of a circuit pattern between the cells or the chips to distribute the imaging positions of the SEPs to the plurality of cells or chips and image the same.

Further, the image processors 124, 1113 (1116) according to the invention are characterized in that imaging of the local imaging regions (SEP) and generation of a panorama image are performed on the plurality of cells or the plurality of chips having the same pattern structure to thereby generate a plurality of panorama images. Further, the invention is characterized in that the layout (the stitching positions) of the SEPs constituting each of the plurality of panorama images can be set to vary with every panorama image (the advantages of generating the plurality of panorama images and varying the layout of the SEPs with each of the plurality of panorama images are mentioned in the description of contour line equalization (step S61) mentioned later).

Further, the imaging recipe creating devices 123, 1112 (1116) according to the invention are characterized in that some or all of splitting to the SEPs and decision on the imaging sequence (the layout of the imaging points and the imaging order of SEPs) in the steps S55 and S56 are performed based on the design data on the circuit pattern stored in the databases 127, 1111. It needs to be known what pattern exists at least within the EP imaging region in order that the imaging recipe creating devices 123, 1112 (1116) according to the invention decide the SEPs and the imaging sequence. Further, it is considered to arrange the adjustment points in the periphery of the EP within the visual field movable range. In that case, the pattern information on the EP and its periphery needs to be known. For example, it is considered that the pattern of the EP and its periphery is once imaged at low magnification, thereby obtaining the pattern array. However, it causes problems wherein resolution is low, the imaging time is required, and some contamination occurs. Therefore, the imaging recipe creating devices 123, 1112 (1116) according to the invention can obtain the pattern information off-line (dispensing with the imaging unit) by using the design data input in the step S52. Further, as described above, there are a lot of evaluation items to be considered in deciding the SEPs and the imaging sequence, and it takes much time to perform manual optimization. Therefore, the imaging recipe creating devices 123, 1112 (1116) according to the invention are characterized in that the input design data is analyzed by software to thereby automatically decide the SEPs and the imaging sequence.

The imaging recipe creating devices 123, 1112 (1116) according to the invention save as the imaging recipe the size and coordinates and the imaging condition of the SEPs, the size and coordinates, the imaging condition, the adjustment method and imaging order of various kinds of adjustment points for imaging the EP and the register template (step S57).

2.3 Imaging & Panorama Image Synthesis/Contour Line Extract/Contour Line Equalizing Step The plurality of SEPs are sequentially imaged based on the imaging recipe created in the step S57 using the SEM (step S58). The image processors 124, 1113 (1116) according to the invention stitch the SEP image groups imaged at the plurality of SEPs, respectively, by the image processing to thereby generate a panorama image in the step S59. The above stitching includes some or all of x and y direction alignment between the SEP images, distortion correction and brightness correction. In the step S60, the contour line of the pattern is extracted from the generated panorama image by the image processing. Further, when a plurality of panorama images are generated in the step S59, the contour line group is calculated from the plurality of panorama images, and the average contour line is calculated from the contour line group (step S61). The average contour line can equalize shape variation due to edge roughness or the like to obtain contour line information with less variation.

Further, the image processors 124, 1113 (1116) according to the invention set the layout (the stitching positions) of the SEPs constituting the plurality of panorama images to vary with every panorama image. Further, the image processors 124, 1113 (1116) according to the invention calculate the contour line group from the obtained panorama image group and calculate the average contour line from the contour line group. As to the accuracy of the contour line at the stitching position (the overlapping region) between the SEPs, there is a high risk that the detection accuracy is lowered as compared with the contours of the other parts due to the problems in the degree of contamination and the stitching accuracy. Then, since the average contour line is the average of panorama images groups different in stitching position (overlapping region) between the SEPs, shape errors of contour lines occurring at the stitching parts are equalized to obtain contour line information with less variation. As a method of generating the average contour line, it is varied as follows: the average value of coordinates of the plurality of corresponding contour lines may be used; or after the contour lines with low reliability (e.g. the contour line calculated from the overlapping region) is excluded, the contour lines are averaged. Since the plurality of panorama images are thus generated, the imaging recipe generation such as imaging of the SEP images at the plurality of cells or chips having the same pattern structure or variation in overlapping regions between the plurality of panorama images can be performed in the steps S55, S56, S57.

2.4 Display/Image and Numerical Data Output & Alteration of Design and Manufacturing Condition The image processors 124, 1113 (1116) can display the panorama image and the information on the contour line generated in the steps S59, S60, S61 on the GUI of the processing terminal 126 or the like or output the same as an image or numerical value data. The shape measurement and evaluation tool servers 125, 1114 (1116) can calculate a shape difference between the comparison pattern and the contour line, and display and output the same. As the comparison pattern, the design data on the pattern shape, the past picked-up image picked up for comparison, and simulation result of estimating a real pattern shape from a mask pattern by the EDA tool 1109 or the like can be used.

The shape measurement and evaluation tool servers 125, 1114 (1116) can alter the design and manufacturing conditions based on the panorama image or the contour line information obtained from the image processors 124, 1113 (1116). For example, in the case of a panorama image of a mask, the pattern shape generated on the mask can be obtained, and high-accuracy simulation estimation of the pattern shape transferred on the wafer taking the pattern shape as input can be achieved (step S64). The shape measurement and evaluation tool servers 125, 1114 (1116) can achieve calculation of a manufacturing error and feedback to the manufacturing condition by comparison between the pattern shape generated on the mask and the design data on the mask (step S65). The shape measurement and evaluation tool servers 125, 1114 (1116) can obtain the pattern shape generated on the wafer when a panorama image of the wafer is obtained from the image processors 124, 1113 (1116), and perform calculation of a manufacturing error, feedback to a manufacturing parameter such as exposure condition (step S66) and further alteration of a mask pattern for a shape error that cannot be corrected completely by alteration of the manufacturing parameter to achieve high yield. As to alteration of the mask pattern, only the OPC pattern is altered (OPC calibration) in some cases, or the layout itself of the circuit pattern is altered in some cases.

3. Details

The parts requiring detailed description in the processing flow shown in FIG. 5 will now be picked out and a supplementary explanation will be made for the parts.

3.1 SEP/Imaging Sequence Generation

One embodiment of a panorama image in observing a mask with OPC will be described using FIG. 6. FIG. 6(*a*) is one embodiment in which part of the mask pattern without OPC is displayed, and FIG. 6(*b*) is a diagram showing one embodiment of a pattern in which OPC is conducted to FIG. 6(*a*). A correction pattern and an assist pattern commonly called Hammerhead, Serif, and SRAF (Sub Resolution Assist Feature) are added. Further, shape correction based on detailed simulation called model base OPC is often performed so that the pattern shape is complicated. It is necessary to verify that such an OPC pattern is suitably generated on the mask, or that the pattern as designed is transferred onto the wafer by the mask. When disadvantage occurs, it is necessary to further correct the OPC pattern. A dotted line 501 shows one embodiment of an EP range designated by a user. When the EP is a wide range, since it is difficult to obtain a high-resolution image by one time imaging, the imaging recipe creating devices 123, 1112 (1116) decide the SEPs so that the wide-range EP are split into a plurality of SEPs and SEM imaged. FIG. 6(*c*) shows one embodiment in which the plurality of SEPs are arranged like a grid for the wide-range EP. In the present embodiment, nine SEPs SEP502-1, SEP502-2, . . . SEP502-9 (hereinafter referred to as SEP502-1 to 502-9) are set like a grid to fill up the EP. In FIG. 6(*c*), hatching is applied to an overlapping region between the SEPs. However, even if the EP is simply split like a grid to set the SEPs, it is often difficult to stitch together the SEPs with high accuracy in the panorama image synthesis. At the SEP502-4, for example, a pattern changing in the y-direction (a pattern edge extending in the x-direction) is not included in the overlapping region, so that even minute y-direction imaging shift occurring in imaging the SEP502-4 cannot be detected. Then, one embodiment in which the positions of the SEPs are corrected so that a pattern changing both in the x-direction and the y-direction is included in the overlapping region of each SEP is shown in FIG. 6(*d*). Similarly nine SEPs SEP503-1 to 503-9 are arranged to fill up the EP, but any SEP includes a pattern changing both in the x-direction and in the y-direction in the overlapping region. Although only the positions are changed in the embodiment of FIG. 6(*d*) for FIG. 6(*c*), it is also possible to change the size of the SEP (change of visual field or magnification; these parameters can be changed in each SEP), and the number of SEPs can be changed (although SEP is 3×3 in FIG. 6(*d*), it can be set to 4×4). Further, it is not necessary that the layout is limited to such a grid.

Figure 7:
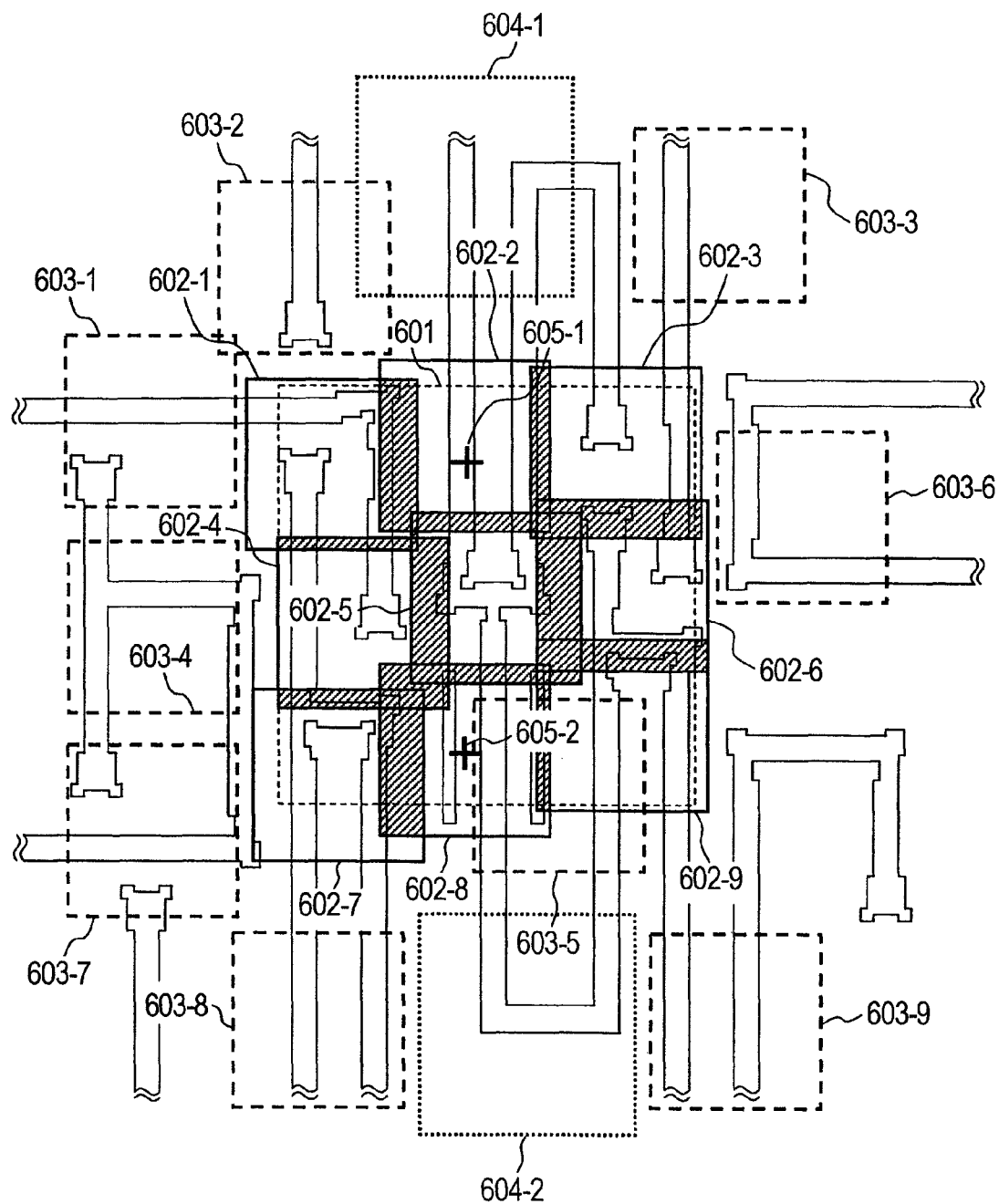
FIG. 7 is a simplified diagram showing the case where a plurality of adjustment points are arranged corresponding to the plurality of SEPs set for obtaining a panorama image of the EP in the panorama image synthesis according to the invention.

The decision of the imaging sequence (the layout (coordinates) and the imaging order of the imaging points) for imaging the SEP503-1 to 503-9 performed in the step S56 and shown in FIG. 6(*d*) will next be described using FIG. 7 and FIG. 8. FIG. 7 is one embodiment in which in order to simplify the description, for example, nine AFs 603-1 to 603-9 (indicated in a long dotted-line frame) set corresponding to the SEP602-1 to 602-9 and for example, two APs 604-1 and 604-2 (indicated by a short dotted-line frame) set corresponding to the first SEP602-1 and the SEP 602-4 close to the last are set as the adjustment points for imaging the nine SEPs 602-1 to 602-9 set for obtaining a panorama image of the EP 601. The AF and AP are respectively selected by searching for patterns effective for auto focusing and addressing. As to the AF, for auto focusing, the AF is provided substantially corresponding to each SEP, and as to the AP, since positional shift due to stage shift is corrected, it is provided corresponding to the limited SEP.

FIG. 8(*a*) is a diagram showing a comparative example of an imaging sequence, in which the AF603-5 (the adjustment point for imaging the SEP602-5) overlapping the two SEP602-8 and SEP602-9 is imaged before imaging the SEPs 602-8 and 602-9, so that a great deal of contamination occurs at the SEP602-8 and 602-9. In the comparative example of the imaging sequence shown in FIG. 8(*a*), first, after moving by the stage shift so that the vertical entering position of an electron beam to a wafer is located at the coordinates 605-1 indicated by a cross mark, the visual field is moved to the AP604-1 by the image shift, and addressing is performed at the AP604-1 to thereby detect an imaging shift (the image shift after this is done for the displacement from which the imaging shift is subtracted). Subsequently, the visual field is moved to the AF603-1 by the image shift, and auto focusing is performed. Subsequently, the visual field is moved to the SEP602-1 by the image shift and the SEP602-1 is imaged.

Hereinafter similarly auto focusing at the AF603-*s* and imaging at the SEP602-*s* are to be repeated with s=2 to 6 in order. Subsequently, after moving by the stage shift so that the vertical entering position of an electron beam to the wafer is located at the coordinates 605-2 indicated by a cross mark, the visual field is moved to the AP604-21 by the image shift, and addressing is performed at the AP604-22 to thereby detect an imaging shift (the image shift after this is done for the displacement from which the imaging shift is subtracted). Subsequently, the visual field is moved to the AF603-7 by the image shift, and auto focusing is performed. Subsequently, the visual field is moved to the SEP602-7 by the image shift and the SEP602-7 is imaged. Hereinafter similarly auto focusing at the AF603-*s* and imaging at the SEP602-*s* are to be repeated with s=8, 9 in order. The reason why the vertical entering position of the electron beam is moved to the coordinates 605-2 by the stage shift in the midway is that it is difficult to move the visual field to all of the imaging points (SEPs 602-1 to 602-9, AFs 603-1 to 603-9, APs 603-1, 603-2) by the image shift from the electron beam vertical entering position at a certain point.

In the comparative example of the imaging sequence shown in FIG. 8(*a*), however, the 603-5 (the adjustment point for imaging the SEP602-5) overlapping two SEP602-8 and 602-9 is imaged before imaging the SEP602-8 and 602-9, resulting in the problem that a great deal of contamination occurs at the SEPs 602-8 and 602-9. This results from the situation where the plurality of SEPs adjoin each other in the panorama image. For example, the adjustment point 603-5 for imaging the SEP602-5 cannot be arranged without overlapping adjacent SEPs 602-8 and 602-9. That is, the adjustment point 603-5 for imaging the SEP602-5 includes an adjustment pattern for imaging the SEP602-5, and also needs to approach the SEP602-5, so that it has to be arranged overlapping the other SEPs such as SEPs 602-8 and 602-9. Actually, the number of SEPs set for obtaining a panorama image of the EP601 increases, and naturally the number of the adjustment points also increases, so that the adjustment point has to be arranged overlapping the SEP.

FIG. 8(*b*) is a diagram showing one embodiment in which the imaging sequence is optimized according to the invention. Generally when the SEPs 602-8 and 602-9 are imaged after imaging the adjustment point 603-5 overlapping the SEPs 602-8 and 602-9, contamination occurs within the images of the SEP602-8 and 602-9, which badly influences the measurement accuracy for the observed pattern shape. On the contrary, various kinds of adjustments at the adjustment point 603-5 tend to be comparatively hardly influenced by the contamination. Then in the imaging sequence according to the invention shown in FIG. 8(*b*), neither auto focusing at the AF603-5 overlapping the SEPs 602-8 and 6029 performed after imaging the adjustment point 603-4 nor imaging at the SEP602-5 corresponding to the AF603-5 is performed, but auto focusing at the AF603-6 and imaging at the SEP602-6 are performed first. Auto focusing at the AF603-5 overlapping the SEPs 602-8 and 602-9 and imaging at the SEP602-5 corresponding to the AF603-5 are performed after completing the imaging all of the SEPs except the SEP602-5. As described above, this invention is characterized in that the imaging sequence is optimized so that when the layout of the adjustment point (AF603-5) is decided so that its imaging region overlaps SEPs 602-8 and 602-9, the SEP602-5 corresponding to the overlapping adjustment point (AF603-5) is imaged immediately after the adjustment at the overlapping adjustment point (AF603-5) after the SEPs 602-8 and 602-9 are imaged, while the SEPs 602-1 to 602-4, 602-6 to 602-9 except the SEP602-5 corresponding to the adjustment point (AF603-5) meet the condition that imaging at the respective SEPs 602-1 to 602-4, 602-6 to 602-9 is performed immediately after the adjustment at the adjustment points AP604-1, AF603-1 to AF603-6, AP604-2, AF603-7 to AF603-9 for the respective SEPs. Since the imaging regions of the overlapping adjustment point (AF603-5) and the SEP602-5 corresponding to the overlapping adjustment point (AF603-5) do not overlap each other, it is possible to prevent the occurrence of contamination within the image of the SEP602-5 and prevent any influence exerted on the measurement accuracy for the observed pattern shape.

That is, the invention is characterized in that in the imaging recipe generation for stitching an image group (SEP group) of local imaging regions split to a multiple for a wide-field imaging region (EP) by image processing to generate a panorama image, the layout of the adjustment points and the imaging sequence including the imaging order of the imaging points including the respective SEPs are optimized and decided so that when the layout of an adjustment point is decided so that the imaging region overlaps an optional SEP of the local imaging region group (the SEP group), while the SEPs except the SEP corresponding to the overlapping adjustment point meet the condition that imaging at the respective SEPs is performed immediately after the adjustment at the adjustment point for each of the respective SEPs, the SEP corresponding to the overlapping adjustment point is imaged immediately after adjustment at the overlapping adjustment point after imaging the optional SEP. That is, the invention is characterized in that in the imaging recipe generation for stitching an image group (SEP group) of local imaging regions split into a plurality for a wide-field imaging region (EP) by image processing to generate a panorama image, the layout of the adjustment point and the imaging sequence including the imaging order of the imaging points (the adjustment points and the local imaging regions) are optimized and decided so that when the layout of an adjustment point is decided so that the imaging region overlaps an optional local imaging region (an optional SEP), the overlapping adjustment point is imaged after imaging the optional local imaging region (the optional SEP).

Incidentally, although the imaging sequence in which two operations of addressing (AP) are respectively performed after the stage shift, and auto focusing (AF) is always performed before imaging each SEP is shown in the embodiment shown in FIG. 7 and FIG. 8(*b*), the number of times of stage shift, deletion and addition of the adjustment points, the timing of adjustment and the like may be altered freely. For example, the imaging sequence may be altered so that auto focusing (AF) is performed only once before the first imaging of the SEP, and the adjustment points such as AST and ABCC may be added to perform adjustment. Further, as to addressing adjustment (APs 604-1, 604-2), AP having higher power is set, and addressing may be performed not only after the stage shift, but also after image shift.

Figure 9:
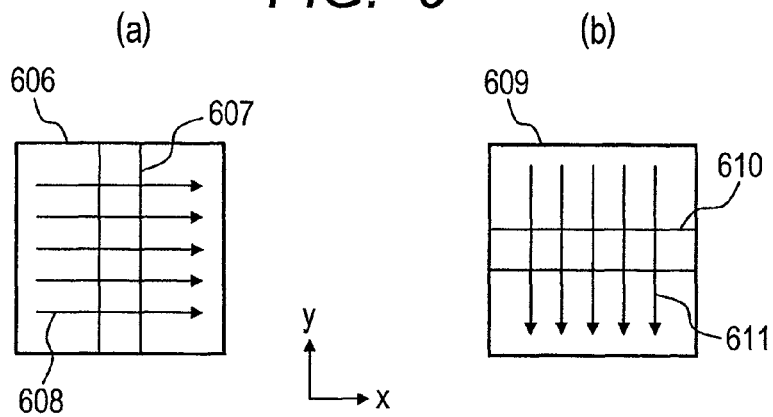
FIG. 9 is a diagram for explaining the imaging condition for clearly imaging a pattern edge in the SEP, which is one of the optimizing items of the imaging sequence, according to the invention.

Although the description of the present embodiment deals with the optimization of imaging order in the imaging sequence, it is possible to perform the optimization including alterations in the electron beam vertical entering position, the size, coordinates and imaging conditions of the adjustment point and further the size, coordinates and imaging conditions of the SEP. The explanation of the imaging conditions will be supplemented. A probe current, an acceleration voltage, the scanning direction of an electron beam and the like are cited as the imaging conditions, and among them, the scanning direction of the electron beam will be described using FIGS. 9(*a*) and (*b*). In order to clearly image a target pattern edge, it is desirable to scan the electron beam in the direction orthogonal to the pattern edge. That is, when a pattern 607 exists extending in the y-direction within the SEP 606 as shown in FIG. 9(*a*), as the scanning direction of the electron beam, continuous scanning in the x-direction is desirable. As the scanning of the electron beam is typically shown by 608 in FIG. 9(*a*), it is considered that an image is obtained by continuously scanning the electron beam in the x-direction two or more times while discretely shifting in the y-direction (shifting in the y-direction is typically five times in the drawing). This is called x-direction electron beam scanning. Similarly, FIG. 9(*b*) is an example of y-direction electron beam scanning. The imaging condition including these electron beam scanning directions is also one of the optimization items in the imaging sequence. The optimization is considered, such as the change of imaging order to continuously image the SEPs uniform in the scanning direction, if possible, so that the scanning direction does not vary with every pattern as described above, or the scanning direction is not changed many times every time the SEP is imaged.

3.2 Overlapping Region between SEPs

Figure 10:
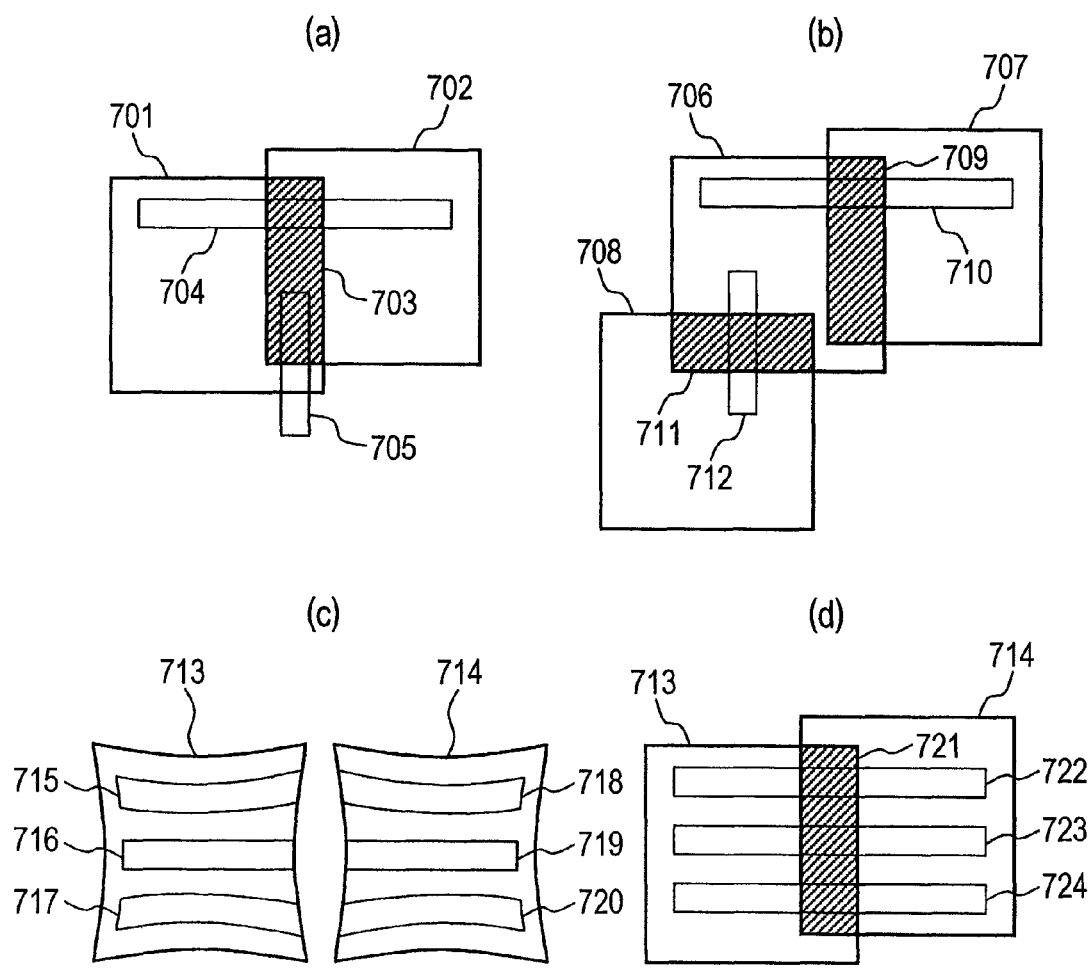
FIG. 10 is a diagram for explaining a method of evaluating the stitching processing in an overlapping region between the adjoining SEPs according to the invention.

A method of calculating an evaluation value in an overlapping region between the adjoining SEPs performed by the image processors 124, 1113 (1116) according to the invention will be described using. FIG. 10. In the overlapping region having high evaluation value, the stitching processing between the SEPs (x and y direction alignment, distortion correction, brightness correction part or all) can be favorably conducted, so that a seamless panorama image can be generated. Therefore, the evaluation value can be one of criterion for judgment when the imaging recipe creating devices 123, 1112 (1116) according to the invention decide the SEP and the imaging sequence.

In order to align the SEP with each other in the x and y directions, it is desirable that the pattern edges extending in the x and y directions are included in an overlapping region 703 (a hatched region) between the SEP 701, 702 as shown in FIG. 10(*a*) to detect the imaging shift when imaging shift occurs in the x and y directions (mainly the edge extending in the x-direction is included in a pattern 704 and the edge extending in the y-direction is included in a pattern 705). An evaluation method is considered, in which a high evaluation value is thus given to an overlapping region where the edges extending in the x and y directions are enough included.

It is, however, sometimes difficult to set the SEPs so that patterns changing both in the x-direction and the y-direction are included in one overlapping region. Then, as shown in FIG. 10(*b*), as to the alignment for the SEP 706, the x-direction alignment is performed in an overlapping region of a SEP 708 (including a pattern 712 extending in the y-direction), and the y-direction alignment is performed in an overlapping region of a SEP 707 (including a pattern 710 extending in the x-direction) to thereby achieve alignment both in the x-direction and in the y-direction. Thus, an evaluation method is considered, in which a high evaluation value is given to an overlapping region where the alignment can be achieved using a plurality of overlapping regions.

In the case of correcting distortion of an image in the SEP image, it is desirable that patterns to be aligned are equally distributed in an overlapping region of the SEPs. FIG. 10(*c*) shows the picked-up images 713, 714 of the two adjoining SEPs. In the present embodiment, a big distortion occurs in both of the images. FIG. 10(*d*) shows the result of stitching together the picked-up images 713, 714. An overlapping region is a hatched region 721, and two patterns 715, 718 in FIG. 10(*c*) are stitched to form a pattern 722 in FIG. 10(*d*). The same processes are applied to the two patterns 716, 719 to form the pattern 723, and the two patterns 717, 720 to form the pattern 724. The reason why both the images 713 and 714 can be suitably subjected to distortion correction and stitched together as shown in FIG. 10(*d*) is that the patterns to be aligned are equally distributed in the overlapping region 721 (for example, it is probably difficult to correct distortion of the SEPs 706, 707 using only the overlapping region 709 in FIG. 10(*b*)). It is considered that the distribution of patterns is thus reflected in the evaluation value on the overlapping region.

Figure 11:
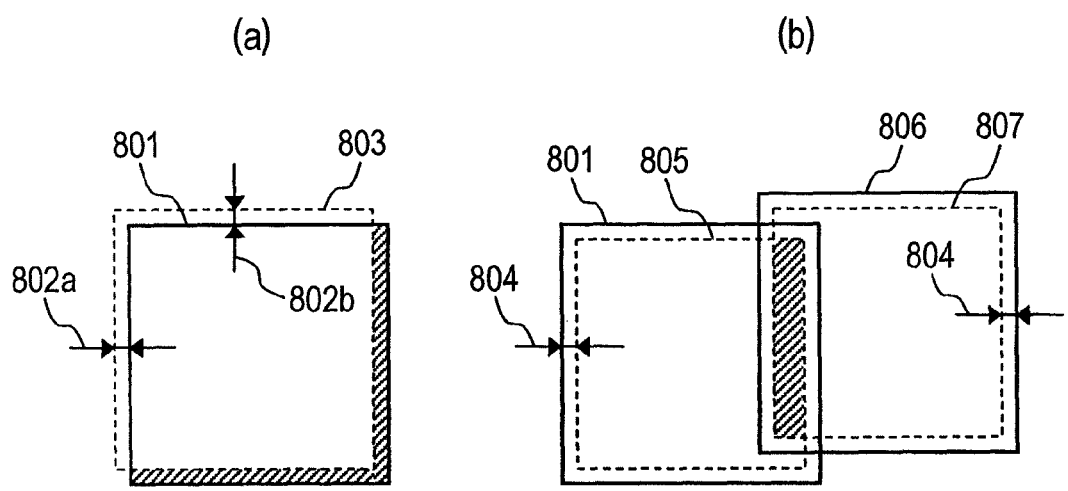
FIG. 11 is a diagram for explaining a method of evaluating the stitching processing in consideration of imaging shift in the overlapping region between the adjoining SEPs according to the invention.

Further, the present invention is characterized in that imaging shift is taken into consideration in evaluating a pattern included in an overlapping region. That is, when an imaging shift 802*a* in the x-direction and an imaging shift 802*b* in the y-direction occur as shown in FIG. 11(*a*), as to the specified SEP imaging position 801, the actual imaging position is 803 which is indicated by a dotted line frame. Therefore, when it is assumed that an overlapping region with another SEP exists within the hatched region in FIG. 11(*a*) and the stitching process is performed depending on patterns included in the overlapping region within the hatched region, the stitching process results in failure (because the pattern assumed to be used for the stitching process is out of the overlapping region due to the imaging shift). Then, the imaging recipe creating devices 123, 1112 (1116) according to the invention set an inhibit region 805 (indicated by a dotted line frame) having a width 804 from the periphery of an SEP 801 as shown in FIG. 11(*b*), so that the patterns in the space from the periphery of the SEP to the dotted line frame are not evaluated to thereby select an SEP that is robust against the imaging shift of the width 804. FIG. 11(*b*) shows another SEP 806, and the SEP 806 is also provided with an inhibit region 807, whereby a pattern evaluated as a key to the stitching processing between the SEPs 801, 806 is only the pattern included in the hatched region in FIG. 11(*b*). As a value of the width 804, an estimated imaging shift can be used. The vicinity of the periphery of the SEM image often becomes unstable, so that it cannot be used for measurement. Therefore, the vicinity of the periphery may be used as a value of the width 804. Further, a larger one between the estimated imaging shift amount and the vicinity of the periphery may be taken as a value of the width 804.

3.3 Distribution of SEP to Cell/Chip

Figure 12:
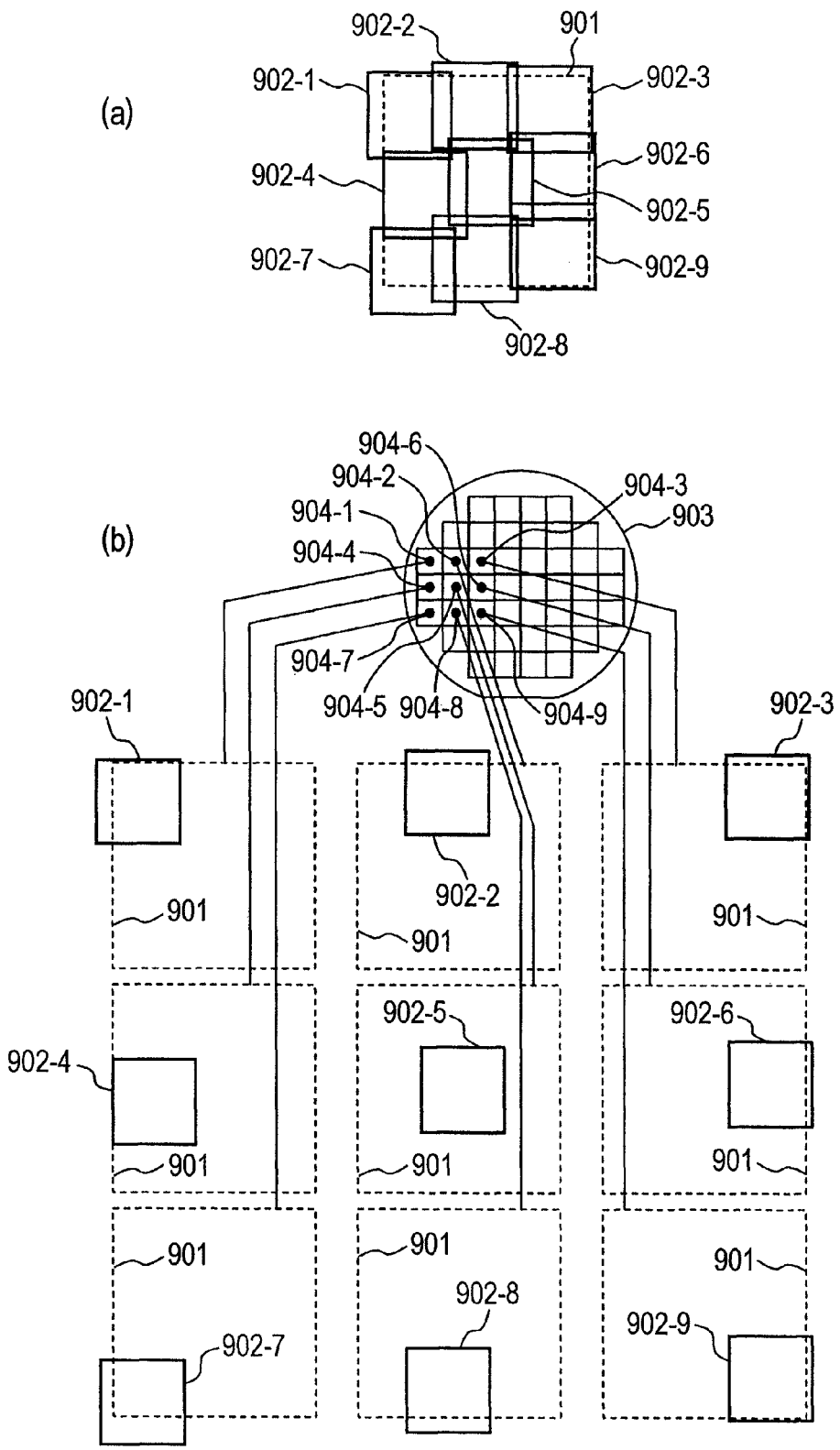
FIG. 12(a) is a diagram showing the plurality of SEPs set for obtaining a panorama image of the EP.
FIG. 12(b) is a diagram showing one embodiment of a method of distributing the imaging positions of the plurality of SEPs to different cells or chips according to the invention.

The imaging recipe creating devices 123, 1112 (1116) according to the invention is characterized by distributing the imaging positions of a plurality of SEPs in deciding (S55) the plurality of split SEPs to the coordinates on a plurality of cells or a plurality of chips having the same pattern on a sample in order to reduce the occurrence of contamination in an overlapping region between the SEPs. FIG. 12(*a*) shows nine SEPs 902-1 to 902-9 set for obtaining a panorama image of an EP 901. However, since the overlapping regions between the SEPs 902-1 to 902-9 are imaged at least twice, a great deal of contamination occurs. Then, the imaging positions of the SEPs 902-1 to 902-9 are, as shown in FIG. 12(*b*), respectively distributed on chips 904-1 to 904-9. Since the patterns of the same design are repeatedly created on the respective chips arranged on a wafer 903, imaging can be performed at positions corresponding to the respective SEPs in the respective chips in the imaging process, so that the occurrence of contamination in the overlapping regions can be reduced.

Figure 13:
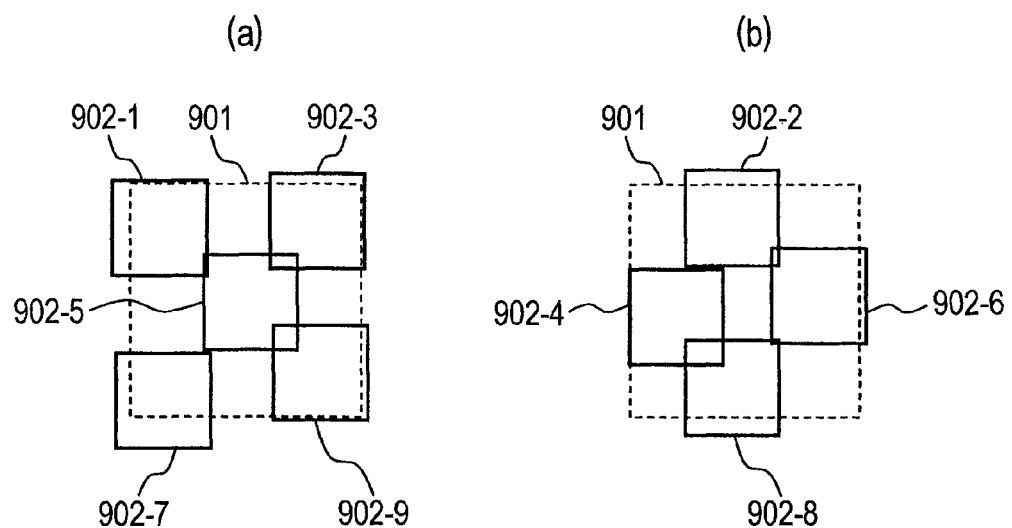
FIG. 13(a) and FIG. 13(b) are diagrams showing one embodiment of a method of distributing the imaging positions of the plurality of SEPs like a check according to the invention.

Further when it is taken into consideration that the workmanship of a pattern is occasionally different in a plane, it is desirable to perform the above distribution in a local range if possible. Then, according to the invention, instead of the chips, the imaging positions of the plurality of SEPs may be distributed to cells repeated in the chip. A combination of SEPs to be distributed may be varied. That is, according to the invention, the respective SEPs may be all distributed to different cells or chips as shown in FIG. 12(*b*), and the SEPs may be combined like a check to distribute the imaging positions as shown in FIGS. 13 (*a*), (*b*). In FIGS. 13(*a*), (*b*), in the imaging process, the SEPs 902-1, 902-3, 902-5, 902-7 and 902-9 are taken as one combination (set 1), and imaged at one cell or chip, and the other SEPs 902-2, 902-4, 902-6, 902-8 are taken as another combination (set 2), and imaged at another cell or chip different from the above one cell or chip. Imaging is thus performed, so that although a great deal of contamination occurs in the overlapping region between the SEPs included in the set 1 and in the overlapping region between the SEPs included in the set 2, the occurrence of contamination in the other overlapping regions can be restrained. This combination of sets of SEPs may be set optionally.

3.4 Generation of Multiple Panorama Images

Figure 14:
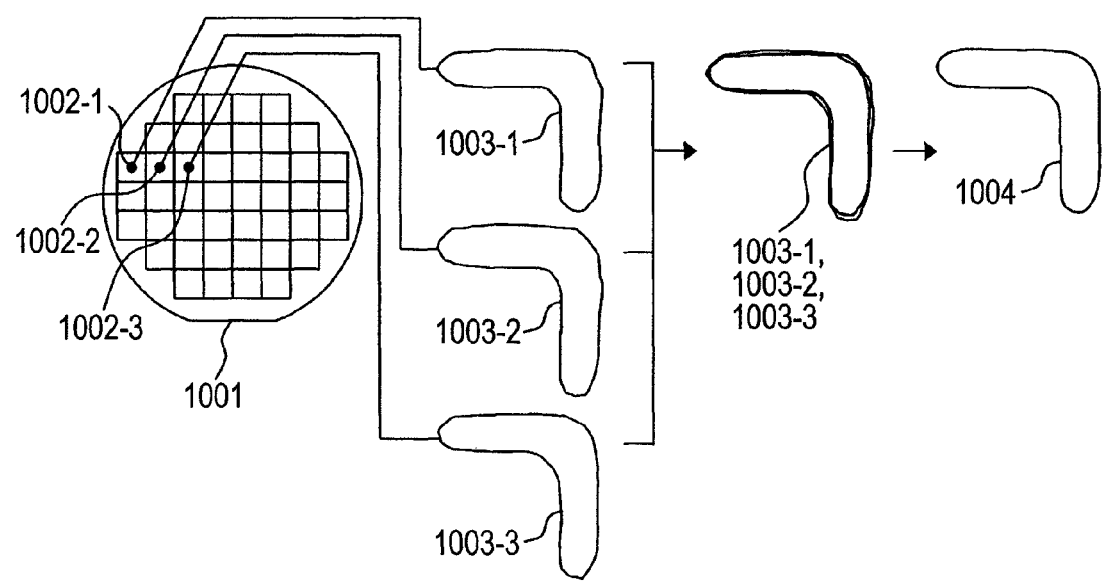
FIG. 14 is a diagram showing one embodiment of a method of generating a plurality of panorama images according to the invention.

The image processors 124, 1113 (1116) according to the invention are characterized in that in the mosaic process, a panorama image is generated on a plurality of cells or a plurality of chips having the same pattern structure on a sample to generate a plurality of panorama images. As a result, as shown in FIG. 14, for example, at three chips 1002-1 to 1002-3, images are picked up to generate a panorama image, and three corresponding contour lines 1003-1 to 10003-3 can be obtained from the panorama image (the contour line is one pattern included in the panorama imaging region that is extracted for explanation). The respective contour lines somewhat vary in shape due to edge roughness or the like. Then, the three contour lines 1003-1 to 1003-3 are equalized to obtain a less varying contour line 1004.

Figure 15:
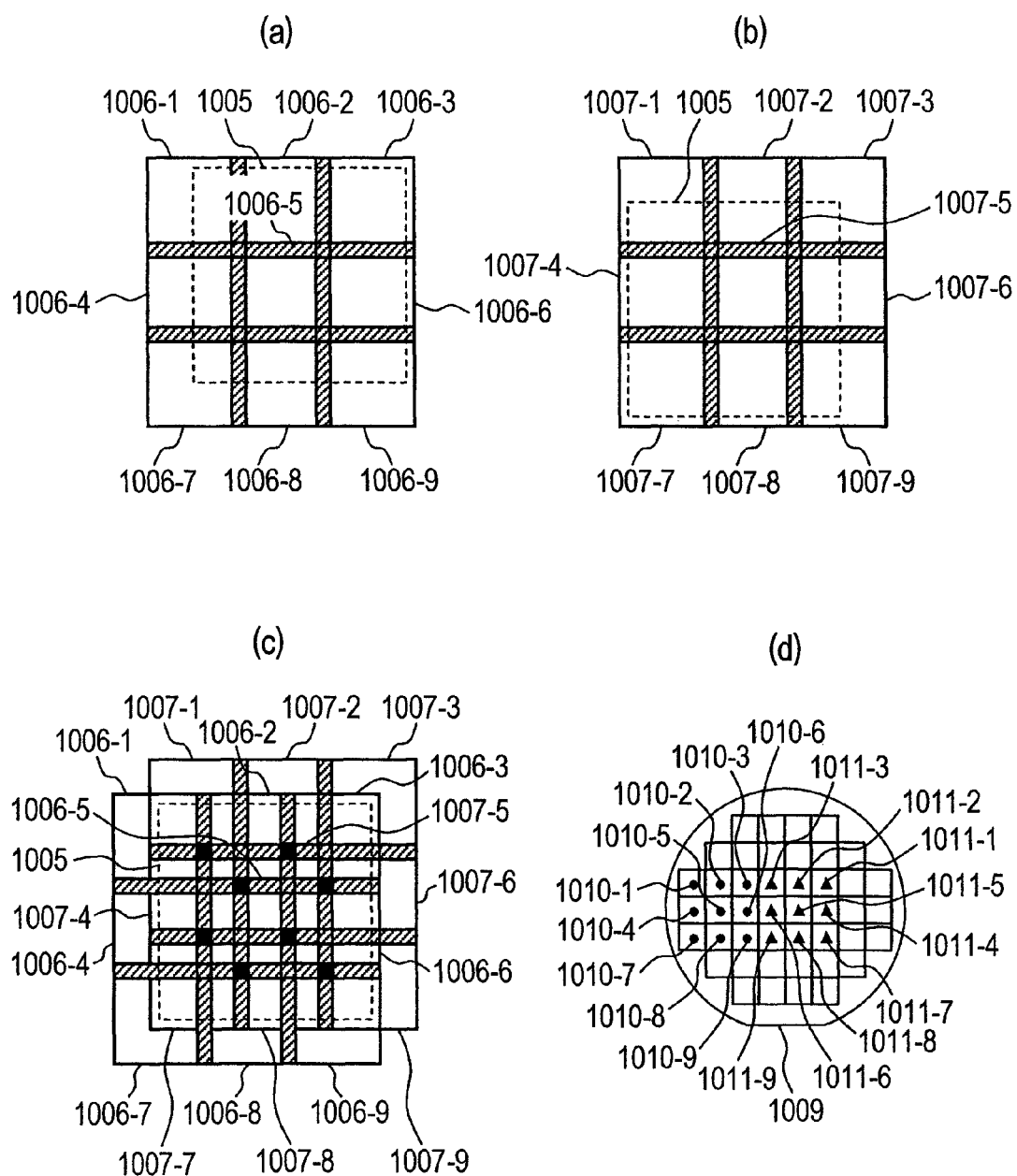

Further, there is high risk that the accuracy of the contour line in the overlapping region between the SEPs is lowered in the detection accuracy as compared with the contour lines of the other parts due to problems in degree of contamination and stitching accuracy. Then, the image processors 124, 1113 (1116) according to the invention are characterized in that in the above generation of multiple panorama images, the stitching position of the constituting SEPs varies with every multiple panorama images. An embodiment of splitting for SEPs different in overlapping region is shown in FIGS. 15(*a*), (*b*). The same EP 1005 is split like SEPs 1006-1 to 1006-9 in FIG. 15(*a*), and like SEPs 1007-1 to 1007-9 in FIG. 15(*b*). Although an overlapping region in FIG. 15(*a*) and an overlapping region in FIG. 15(*b*) partly overlap each other, the overlapping area is small, so that a stitching error or the like can be reduced by equalization. FIG. 15(*c*) shows the condition where FIG. 15(*a*) and FIG. 15(*b*) are superposed one on the other at the corresponding coordinates. A region painted black in FIG. 15(*c*) is an overlapping region of the overlapping region of FIG. 15(*a*) and the overlapping region of FIG. 15(*b*).

Further, as shown in FIG. 15(*d*), it is possible to combine the distribution of SEPs described using FIG. 12 and FIG. 13 with the generation of multiple panorama images described using FIG. 14 and FIG. 15. That is, FIG. 15(*d*) is an embodiment in which nine SEPs constituting one panorama image are distributed to chips 1010-1 to 1010-9 and imaged, similar imaging is performed at chips 1011-1 to 1011-9 (concerning the 1010-*a*, 1011-*b*, at chips having suffixes a, b that are the same, the SEPs having the same relative positions at the chip coordinates are imaged), thereby generating two panorama images having the patterns of the same design.

5. GUI

Figure 16:
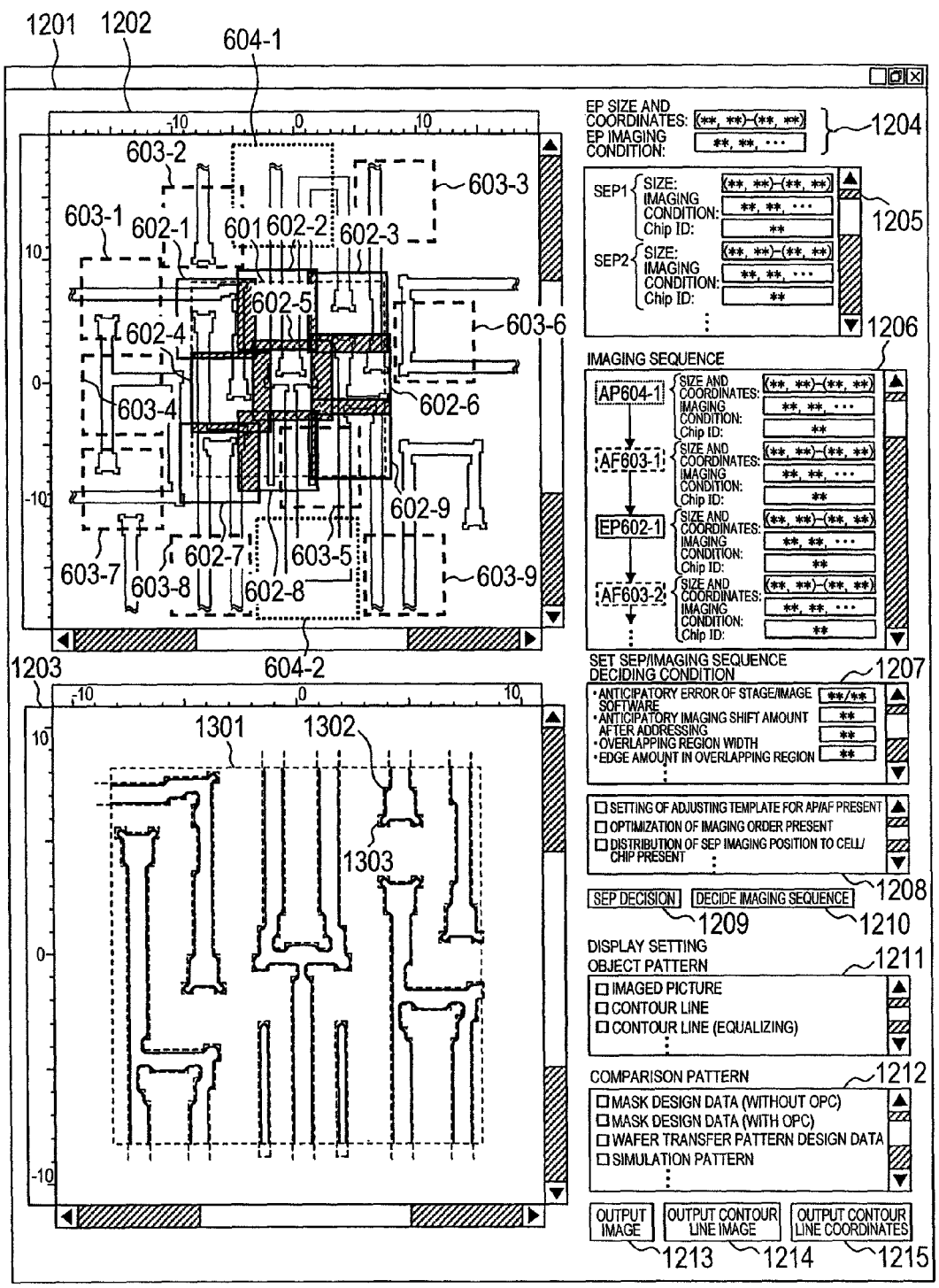
FIG. 16 is a diagram showing one embodiment of GUI screen displayed on a processing terminal or the like in the panorama image synthesis according to the invention.

FIG. 16 shows an embodiment of a GUI such as processing terminals 126 and 118 for setting or displaying input or output information according to the invention. Various kinds of information pieces written on one screen in a window 1201 in FIG. 16 can be divided into windows by an optional combination and displayed on a display or the like. The signs  in FIG. 16** designate an optional numerical value (or a character string) and a range of a numerical value input or output to a system.

In a box 1204, the size, coordinates and imaging conditions of the EP are displayed. In a window 1205, the number, size and imaging conditions of SEPs, and a chip ID of the imaging position are displayed. In a window 1206, an imaging sequence is displayed. To be specific, the size, and coordinates of the imaging point, the imaging conditions, the chip ID, the imaging order and the like are displayed. In a window 1207, the deciding conditions of the SEP and the imaging sequence are displayed. To be specific, an estimated stage/image shift error, an estimated imaging shift amount after addressing, a width of an overlapping region, an edge amount in the overlapping region and the like are displayed. In check boxes in a window 1208, setting or not of an adjustment template, optimization or not of imaging order, distribution or not of SEP imaging positions to cells/chips and the like are displayed. Some or all of the setting items of the above 1204 to 1208 are set as needed, and a SEP decision button 1209 and an imaging sequence decision button 1210 are pressed to thereby decide the SEPs and the imaging sequence based on the set items. It is not necessary to designate all of the setting items in the above 1204 to 1208, the system decides the SEPs and the imaging sequence to meet the designated items. Concerning the items not designated, estimation and setting can be performed in the interior of the system as needed. Therefore, the boxes, the windows and the check boxes 1204 to 1208 serve as inputting means for parameters and also as display means for the parameters set in the interior of the system. The decided SEPs and imaging sequence can be visualized and displayed in the window 1202. The diagram in the window 1202 is the same as FIG. 6(*a*), so the description is eliminated.

Further it is possible to display a target pattern such as a panorama image generated in a window 1203, and overlay and display the target pattern and a comparative pattern. As the target pattern, a picked-up image (an SEP image/a panorama image), a contour line extracted from the image, an equalized contour line calculated using a plurality of panorama images and the like can be selected by a window 1211 and displayed. Further, as the comparative pattern, mask design data (without OPC/with OPC), wafer transfer pattern design data, simulation pattern and the like can be selected by a window 1212, and overlaid and displayed to the target pattern. Further, an image output button 1213, a contour line image output button 1214, and a contour line coordinates output button 1215 are pressed to thereby output the respective data.

Figure 17:
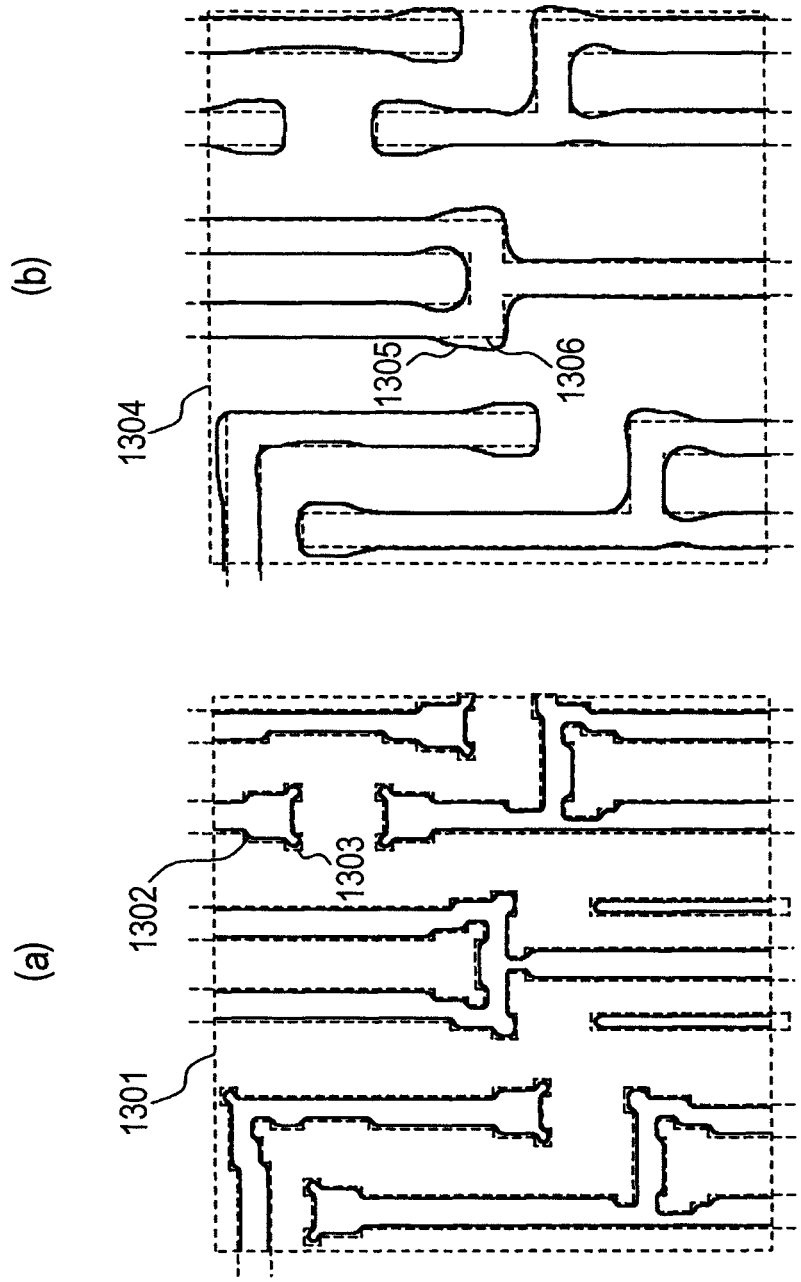
FIG. 17 is a diagram showing information displayed on a window in FIG. 16 to an enlarged scale.

The information displayed in the window 1203 of FIG. 16 is displayed to an enlarge scale in FIG. 17. FIG. 17(*a*) is an overlay display of a panorama image (a picked-up image) or a contour line 1302 (indicated by a solid line) in the case of observing an EP 1301 on a mask and design data 1303 on the mask (indicated by a dotted line). FIG. 17(*b*) is an overlay display of a panorama image (a picked-up image) or a contour line 1305 (indicated by a solid line) in the case of observing an EP 1304 on a wafer and design data 1306 on a pattern transferred onto the wafer (indicated by a dotted line).

Although the description of the above embodiment deals with the method of obtaining a wide range contour line information by generating a panorama image and then extracting the contour line of a circuit pattern from the panorama image, this is not restrictive in the invention. A contour line group may be extracted from the picked-up images of a plurality of SEPs, and then the contour line groups may be stitched to thereby obtain a wide range contour line information.

Further, although the description of the embodiment deals with the system using the SEM (Scanning Electron Microscope), this is not restrictive in the invention, but the invention may be applied to the scanning charged-particle microscope such as SIM (Scanning Ion Microscope) or STEM (Scanning Transmission Electron Microscope).

According to the described embodiment of the invention, the pattern shape generated on the mask can be obtained from the panorama image obtained by observing the mask, and the pattern shape is input to achieve high-accuracy simulation prediction for a pattern shape to be transferred onto the wafer. Further, according to the embodiment of the invention, calculation of a manufacturing error and feedback to the manufacturing condition are achieved by comparison between the pattern shape generated on the mask and the design data on the mask.

Further, according to the embodiment of the invention, the pattern shape generated on the wafer from the panorama image obtained by observing the wafer can be obtained, and compared with the design data on the generated pattern to thereby calculate a manufacturing error, feedback to a manufacturing parameter such as exposure condition, and further alter the mask pattern for the shape error that cannot be corrected perfectly by alteration of the manufacturing parameter, so that high yield can be achieved.

INDUSTRIAL APPLICABILITY

The super resolution exposure technology represented by optical proximity correction (OPC) has been introduced because of decrease in design margin caused by advance to the microstructure and high densification of the semiconductor device. A mask pattern becomes complicated with this introduction, so it is more important to simulate and estimate a pattern shape transferred onto a wafer and inspect an actually transferred pattern shape. This invention provides the method of obtaining a wide-field and high resolution image using the scanning charged-particle microscope. The design of a semiconductor device pattern and the feedback to a manufacturing process are enabled by inspecting the wide-field and high resolution image and the pattern shape using the image.

REFERENCE SIGNS LIST

101 . . . Semiconductor wafer
102 . . . Electronic optical system
103 . . . Electron gun
104 . . . Electron beam (primary electron)
105 . . . Condenser lens
106 . . . Deflector
107 . . . ExB deflector
108 . . . Objective lens
109 . . . Secondary electron detector
110, 111 . . . Back scattered electron detector
112~114 . . . A/D converter
115 . . . Processing and control part
116 . . . CPU
117 . . . Image memory
118, 126 . . . Processing terminal
119 . . . Stage controller
120 . . . Deflection control part
121 . . . Stage
122 . . . Stage tilt angle
123 . . . Imaging recipe creating device
124 . . . Image processor
125 . . . Shape measurement and evaluation tool server
127 . . . Database (storage)
201~206 . . . Entering direction of converged electron beam
207 . . . Sample surface
208 . . . Image coordinate system
209 . . . Image
308 . . . Image shift movable range from SEP
309 . . . SEP
310 . . . AP
311 . . . AF
312 . . . AST
313 . . . ABCC
501 . . . EP
502-1~502-9, 503-1~503-9 . . . SEP
601, 606, 609 . . . EP
602-1~602-9 . . . SEP
603-1-603-9 . . . AF
604-1, 604-2 . . . AP
605-1, 605-2 . . . Electron beam vertical entering position
607, 610 . . . Circuit pattern
611 . . . Electron beam scanning
701, 702, 706~708, 713, 714 . . . EP
704, 705, 710, 712, 715~720, 722~724 . . . Circuit pattern
801, 806 . . . EP
802a, 802b . . . Imaging shift
803 . . . Actual EP imaging position
804 . . . Inhibit region width
805, 807 . . . Inhibit region
901 . . . EP
902-1~902-9 . . . SEP
903 . . . Wafer
904-1~-904-9 . . . Chip
1001, 1009 . . . Wafer
1002-1~1002-3, 1010-1~1010-3, 1011-1~1011-3 . . . Chip
1003-1~1003-3 . . . Contour line
1004 . . . Average contour line
1005 . . . EP
1006-1~1006-9, 1007-1~1007-9 . . . SEP
1101 . . . Mask pattern design device
1102 . . . Mask pattern drawing device
1103 . . . Exposure and developing device
1104 . . . Etching device
1105, 1007 . . . SEM device
1106, 1108 . . . SEM control device
1109 . . . EDA tool server
1110 . . . Database server
1111 . . . Database
1112 . . . Imaging recipe creating device
1113 . . . Image processor
1114 . . . Shape measurement and evaluation tool server
1115 . . . Network
1116 . . . EDA tool, database management, imaging recipe creation, image processing, shape measurement and evaluation tool, Integration server and arithmetic device for SEM control
1201 . . . GUI screen
1202 . . . SEP and imaging sequence display screen
1203 . . . Target pattern and comparison pattern display screen
1204 . . . EP size, coordinates and imaging condition information display box
1205 . . . SEP information display window
1206 . . . Imaging sequence display window
1207, 1208 . . . SEP/Imaging sequence deciding condition setting window
1209 . . . SEP deciding button
1210 . . . Imaging sequence deciding button 1211 . . . Target pattern display setting window
1212 . . . Comparison pattern display setting window
1213 . . . Image output button
1214 . . . Contour line image output button
1215 . . . Contour line coordinate output button
1301, 1304 . . . EP
1302 . . . Picked-up image on mask
1305 . . . Picked-up image on wafer
1303 . . . Design data on mask
1306 . . . Design data on wafer

The invention claimed is:

1. A method of synthesizing a panorama image using a scanning charged-particle microscope, comprising:
   an imaging recipe creating process, which includes:
      a region determining step of determining a wide-field imaging region on a sample imaged using a scanning charged-particle microscope,
      a local region determining step of splitting the wide-field imaging region on the sample determined in the region determining step into a plurality of local imaging regions and determining the same,
      an adjustment point determining step of determining the layout of adjustment points corresponding to the local imaging regions for imaging each of the plurality of local imaging regions split and determined in the local region determining step, and
      an imaging order determining step of determining the imaging order of the local imaging regions that have been split and determined in the local region determining step and the adjustment points, the layout of which is determined in the adjustment point determining step,
   wherein the imaging recipe creating process creates, as an imaging recipe, the imaging sequence including the coordinates of the local imaging regions, the coordinates of the adjustment points, and the imaging order of the local imaging regions and the adjustment points, and
   wherein in the image recipe creating process, when a layout of adjustment points of a local imaging region is determined in the adjustment point determining step, such that the imaging region of the adjustment points overlaps an optional local imaging region, the imaging sequence is created in the imaging order determining step as the imaging recipe, such that while the optional local imaging region overlapping the adjustment points meets the condition that imaging at the optional local imaging region is performed immediately after adjusting at an adjustment point for the optional local imaging region, at the imaging region corresponding to the adjustment points, imaging is performed immediately after adjusting at the adjustment points after imaging the optional local imaging region;
   an imaging process of sequentially imaging each of the plurality of local imaging regions on the sample, by using the scanning charged-particle microscope according to the imaging recipe created in the imaging recipe creating process; and
   a mosaic process of stitching together the local imaging region image group sequentially imaged in the imaging process by image processing, and generating a panorama image.

2. The method of synthesizing a panorama image using a scanning charged-particle microscope according to the claim 1, wherein in the imaging recipe creating process, some or all of the steps including the region determining step, the local region determining step, the adjustment point determining step, and the imaging order determining step are performed according to design data on a circuit pattern formed on the sample.

3. The method of synthesizing a panorama image using a scanning charged-particle microscope according to the claim 1, wherein in the local region determining step of the imaging recipe creating process, the plurality of local imaging regions are determined such that there is an overlapping region between adjoining local imaging regions, and the overlapping region includes an edge of a pattern which is a key to determining an alignment amount between the local imaging regions or a distortion correction amount of an image.

4. The method of synthesizing a panorama image using a scanning charged-particle microscope according to the claim 3, wherein in the local region determining step of the imaging recipe creating process, in evaluating whether or not the edge of the pattern is included in the overlapping region, an estimated imaging shift amount in imaging the local imaging region is input, and only the edge of the pattern, which is not out of the overlapping region even when an imaging shift for the estimated imaging shift amount occurs, is evaluated.

5. The method of synthesizing a panorama image using a scanning charged-particle microscope according to the claim 1, wherein in the local imaging region determining step of the imaging recipe creating process, the local imaging regions are determined on the basis of the edge of a pattern included in the overlapping region between the local imaging regions, the layout of the adjustment points, and the imaging order of the adjustment points and the local imaging regions.

* * * * *